US012679940B2

(12) United States Patent
Yokoyama

(10) Patent No.: US 12,679,940 B2
(45) Date of Patent: Jul. 14, 2026

(54) LAMINATED FILM AND FLEXIBLE DEVICE

(71) Applicant: DAICEL CORPORATION, Osaka (JP)

(72) Inventor: Masashi Yokoyama, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 452 days.

(21) Appl. No.: 18/035,018

(22) PCT Filed: Nov. 12, 2021

(86) PCT No.: PCT/JP2021/041665
§ 371 (c)(1),
(2) Date: May 2, 2023

(87) PCT Pub. No.: WO2022/102736
PCT Pub. Date: May 19, 2022

(65) Prior Publication Data

US 2023/0399479 A1 Dec. 14, 2023

(30) Foreign Application Priority Data

Nov. 16, 2020 (JP) ................................ 2020-190141

(51) Int. Cl.
*C08J 7/04* (2020.01)
*C08G 77/00* (2006.01)
(Continued)

(52) U.S. Cl.
CPC ............ *C08J 7/042* (2013.01); *C08G 77/045* (2013.01); *C09D 183/10* (2013.01);
(Continued)

(58) Field of Classification Search
None
See application file for complete search history.

(56) References Cited

U.S. PATENT DOCUMENTS

2021/0179795 A1* 6/2021 Mori ...................... B05D 3/067

FOREIGN PATENT DOCUMENTS

JP 2017-33032 A 2/2017
JP 2020-37677 A 3/2020
(Continued)

OTHER PUBLICATIONS

International Preliminary Report on Patentability and Written Opinion of the International Searching Authority for International Application No. PCT/JP2021/041665, dated May 16, 2023, with an English translation.
(Continued)

*Primary Examiner* — Jeffrey D Washville
(74) *Attorney, Agent, or Firm* — Birch, Stewart, Kolasch & Birch, LLP

(57) ABSTRACT

Provided is a laminated film having a high level of surface hardness and excellent bendability, and also having antifouling performance that hardly deteriorates. A laminated film 1 of the present disclosure includes: a support 10; and a resin layer 11 laminated on at least one surface of the support, in which the resin layer satisfies the following Conditions 1, 2 and 3: Condition 1: in a pencil hardness test with a load of 750 g, a pencil hardness is F or greater on a surface of the resin layer of the laminated film; Condition 2: in a cylindrical mandrel test, where the surface of the resin layer of the laminated film is bent into a convex shape, no cracks occur on the surface of the resin layer with a curvature radius of 5 mm; and Condition 3: a surface of the resin layer of the laminated film has a water contact angle of 95° or greater before subjected to a steel wool abrasion test, and a water contact angle on tested areas of the surface is 90° or greater after subjected to the test.

14 Claims, 8 Drawing Sheets

(51) Int. Cl.
*C08G 77/04* (2006.01)
*C09D 183/10* (2006.01)
*H10K 77/10* (2023.01)

(52) U.S. Cl.
CPC ............ *H10K 77/111* (2023.02); *C08G 77/80* (2013.01); *C08J 2367/02* (2013.01); *C08J 2383/10* (2013.01)

(56) References Cited

FOREIGN PATENT DOCUMENTS

| | | | |
|---|---|---|---|
| WO | WO 2016/076257 | A1 | 5/2016 |
| WO | WO 2019/220642 | A1 | 11/2019 |

OTHER PUBLICATIONS

International Search Report for International Application No. PCT/JP2021/041665, dated Dec. 14, 2021, with an English translation.
Japanese Notice of Reasons for Revocation of a Patent for Japanese Application No. 2022-701159, dated Jan. 31, 2023.
Japanese Office Action for Japanese Application No. 2020-190141, dated Dec. 14, 2021.

* cited by examiner

LAMINATED FILM AND FLEXIBLE DEVICE

TECHNICAL FIELD

The present disclosure relates to: a laminated film having a high level of surface hardness, excellent bendability, and excellent scratch resistance; an image display device including the laminated film; and a flexible device. The present disclosure claims priority from the Japanese patent application No. 2020-190141, filed in Japan on Nov. 16, 2020, the contents of which are incorporated herein by reference.

BACKGROUND ART

To further improve the portability of personal digital assistants such as smartphones and tablets, there is an increasing demand for flexible devices such as foldable displays and touch screens. A flexible device needs to be bent at 180° with a small curvature radius (e.g., the curvature radius of about 2.5 mm) to improve the portability, requiring extremely high bendability (flexuosity). Further, since the flexible device is carried in a folded state, opened at the time of use, and folded again after use and repeatedly used, it also needs to have high bending resistance, i.e., durability in which cracks and the like do not occur even when folded repeatedly.

An image display device having high flexibility, such as organic EL, is used in the flexible device. The image display device is generally protected with a laminated film (hard coat film) including a hard coat layer formed on a support film, to impart scratch resistance without causing the image display surface to be scratched when in use, resulting in improving the scratch resistance of the image display surface of the image display device. Further, such a hard coat film is susceptible to contamination by fingerprints, handprints, dust, etc. through touch operation or the like, and is provided with antifouling properties for the purpose of preventing contamination and facilitating removal of adhered contaminants (e.g., Patent Document 1).

CITATION LIST

Patent Document

Patent Document 1: JP 2017-033032 A

SUMMARY OF INVENTION

Technical Problem

In general, a hard coat layer of a hard coat film is allowed to contain an antifouling agent to form an antifouling layer on the surface, thereby imparting antifouling properties to the hard coat film. There has been a case in which, when a flexible device is touched or put into a bag, a pocket, or the like, the cloth is repeatedly rubbed against the surface, causing deterioration in the antifouling properties.

Therefore, an object of the present disclosure is to provide a laminated film which has a high level of surface hardness and excellent bendability and also has characteristics of hardly deteriorating antifouling performance, and is suitable as a surface protective material for a flexible display.

Another object of the present disclosure is to provide an image display device including the laminated film.

Yet another object of the present disclosure is to provide a device including the image display device including the laminated film.

Solution to Problem

That is, the present disclosure provides a laminated film including: a support; and a resin layer laminated on at least one surface of the support, the resin layer, or one of the resin layers when the resin layers are laminated on both surfaces of the support, satisfying the following Conditions 1, 2, and 3:

Condition 1:

in a pencil hardness test specified in JIS K5600 5-4 (1999) at a load of 750 g, a pencil hardness is F or greater on a surface of the resin layer of the laminated film;

Condition 2:

in a cylindrical mandrel test according to a method specified in JIS K5600-5-1 (1999), where the surface of the resin layer of the laminated film is bent into a convex shape, no cracks occur on the surface of the resin layer with a curvature radius of 5 mm; and Condition 3:

a surface of the resin layer of the laminated film has a water contact angle of 95° or greater before subjected to a steel wool abrasion test where the surface of the resin layer is rubbed back and forth 1000 times with #0000 steel wool while a load of 1 kg/cm$^2$ is applied, and a water contact angle on tested areas of the surface is 90° or greater after subjected to the test.

The present disclosure also provides the laminated film, in which the resin layer, or one of the resin layers when the resin layers are laminated on both surfaces of the support, further satisfies the following Condition (Condition 4):

Condition 4: in the following bending resistance test, a number of operations it takes for cracks to occur in the resin layer is 10000 times or more:

bending resistance test:

when an operation of bending the laminated film from an unbent state to a direction where the surface of the resin layer is bent by 180° into a convex shape with a curvature radius (R) of 4.0 mm and unbending the bent laminated film again is defined as one cycle, the operation is performed at a rate of 30 to 60 cycles/min.

The present disclosure also provides the laminated film, in which the resin layer, or one of the resin layers when the resin layers are laminated on both surfaces of the support, further satisfies the following Condition (Condition 5):

Condition 5: no scratches are visually observed in a steel wool abrasion test where the surface of the resin layer is rubbed back and forth 1000 times with #0000 steel wool while a load of 1 kg/cm$^2$ is applied.

The present disclosure also provides the laminated film, in which the resin layer, or one of the resin layers when the resin layers are laminated on both surfaces of the support, has a haze of 1.0% or less.

The present disclosure also provides the laminated film, having a haze of 7% or less.

The present disclosure also provides the laminated film, in which the resin layer includes a cured product of a curable composition containing one or more curable compounds, and at least one of the curable compounds is a polyorganosilsesquioxane.

The present disclosure also provides the laminated film, in which the curable composition contains a compound having one or more cationically polymerizable groups and one or more radically polymerizable groups in a molecule.

The present disclosure also provides the laminated film, in which the curable composition further contains a curing catalyst.

The present disclosure also provides the laminated film, in which the curing catalyst contains a cationic polymerization initiator.

The present disclosure also provides the laminated film, in which the curing catalyst contains a radical polymerization initiator.

The present disclosure also provides the laminated film, in which the curable composition further contains a fluorine-containing radically polymerizable compound.

The present disclosure also provides the laminated film, in which the curable composition further contains an aliphatic compound having two or more cationically polymerizable groups in a molecule.

The present disclosure also provides the laminated film, in which the support includes a transparent support.

The present disclosure also provides an image display device including the laminated film.

The present disclosure also provides the image display device, which is a flexible display.

The present disclosure also provides the image display device, which is an organic electroluminescent display device.

The present disclosure also provides a flexible device including the image display device.

Advantageous Effects of Invention

The laminated film according to the present disclosure has a high level of surface hardness and excellent bendability, and also has antifouling performance that hardly deteriorates. Accordingly, the laminated film can be preferably used as a surface protective material for a flexible device such as a foldable image display device or a rollable image display device.

DESCRIPTION OF EMBODIMENTS

Laminated Film

The laminated film according to the present disclosure is a laminated film including: a support; and a resin layer laminated on at least one surface of the support, in which the resin layer, or one of the resin layers when the resin layers are laminated on both surfaces of the support, satisfies the following Conditions 1, 2, and 3:

Condition 1:

in a pencil hardness test specified in JIS K5600 5-4 (1999) at a load of 750 g, a pencil hardness is F or greater on a surface of the resin layer of the laminated film;

Condition 2:

in a cylindrical mandrel test according to a method specified in JIS K5600-5-1 (1999), where the surface of the resin layer of the laminated film is bent into a convex shape, no cracks occur on the surface of the resin layer with a curvature radius of 5 mm; and Condition 3:

a surface of the resin layer of the laminated film has a water contact angle of or greater before subjected to a steel wool abrasion test where the surface of the resin layer is rubbed back and forth 1000 times with #0000 steel wool while a load of 1 kg/cm$^2$ is applied, and a water contact angle on tested areas of the surface is 90° or greater after subjected to the test.

The laminated film has extremely excellent surface hardness and bendability, and also has antifouling performance that hardly deteriorates. Thus, the laminated film can be preferably used as a surface protective material (e.g., a protective film), a barrier film, a TFT substrate, or the like for a liquid crystal display or a flexible display.

Note that, in the laminated film, when the resin layers are laminated on both surfaces of the support, one of the resin layers may satisfy Conditions 1, 2, and 3, and the other resin layer may or may not satisfy Conditions 1, 2 and/or 3.

Figure 1:
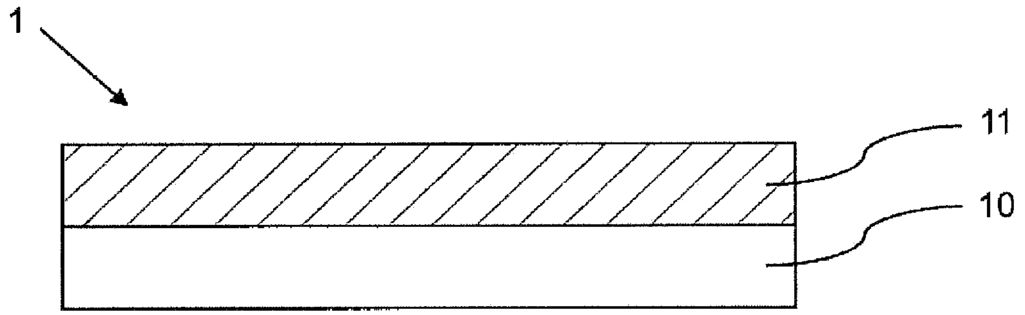
FIG. 1 is a schematic view (cross-sectional view) illustrating a laminated film according to an embodiment of the present disclosure.

FIG. 1 is a schematic view (cross-sectional view) illustrating a laminated film according to an embodiment of the present disclosure, and a laminated film 1 is an embodiment in which a resin layer 11 is laminated on one surface of a support 10. In the laminated film 1, the resin layer 11 satisfies Conditions 1, 2, and 3 described above.

Figure 2:
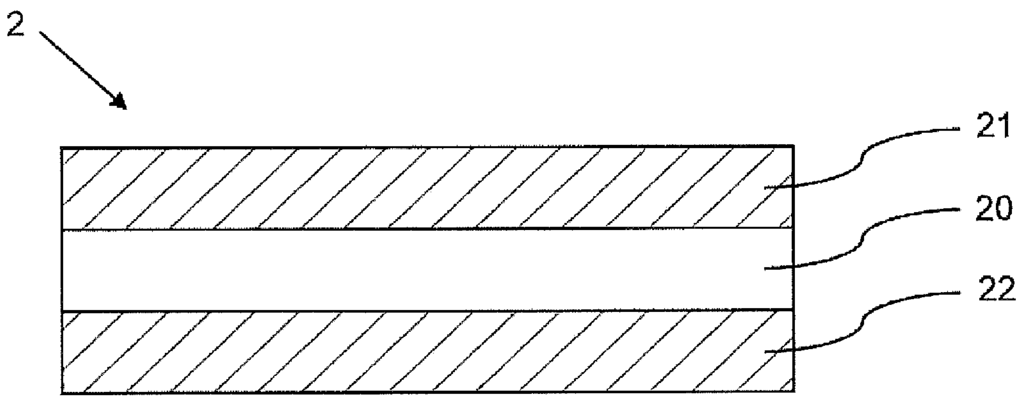
FIG. 2 is a schematic view (cross-sectional view) illustrating a laminated film according to another embodiment of the present disclosure.

FIG. 2 is a schematic view (cross-sectional view) illustrating a laminated film according to another embodiment of the present disclosure, and a laminated film 2 is an embodiment in which a resin layer 21 and a resin layer 22 are laminated on both surfaces of a support 20. In the laminated film 2, either the resin layer 21 or the resin layer 22 may satisfy Conditions 1, 2, and 3 described above.

That is, the laminated film 2 includes the following embodiments (1) to (3):

(1) both the resin layer 21 and the resin layer 22 satisfy Conditions 1, 2, and 3;

(2) the resin layer 21 satisfies Conditions 1, 2, and 3, and the resin layer 22 does not satisfy at least one of these Conditions; and (3) the resin layer 22 satisfies Conditions 1, 2, and 3, and the resin layer 21 does not satisfy at least one of these Conditions.

Condition 1 above indicates that the surface of the resin layer surface in the laminated film has excellent surface hardness. The pencil hardness of the surface of the resin layer in a pencil hardness test (at a load of 750 g) specified in JIS K 5600-5-4 (1999) is F or greater, preferably 1H or greater, more preferably 2H or greater, even more preferably 3H or greater, yet even more preferably 4H or greater, yet even more preferably 5H or greater, yet even more preferably 6H or greater, yet even more preferably 7H or greater, yet even more preferably 8H or greater, and particularly preferably 9H. When the pencil hardness of the surface of the resin layer is less than F, the surface hardness of the laminated film is insufficient, and thus it may be difficult to use the laminated film as a surface protective material for a flexible device.

Condition 2 above indicates that the laminated film has excellent bendability, and specifically, a condition indicating that the laminated film has excellent bendability (which may be hereinafter referred to as "bendability (2)") when the resin layer is bent into a convex shape (outward).

Regarding the bendability (2), the curvature radius is 5 mm or less, preferably 4.5 mm or less, more preferably 4.0 mm or less, even more preferably 3.5 mm or less, yet even more preferably 3.0 mm or less, yet even more preferably 2.5 mm or less, and particularly preferably 2.0 mm or less. When the curvature radius is greater than 5 mm, the bendability of the laminated film is insufficient, and thus it may be difficult to use the laminated film as a surface protective material for a flexible device (in particular, a display device or the like that is bent outward).

Condition 3 above indicates that the surface of the resin layer of the laminated film has excellent antifouling properties and the antifouling performance hardly deteriorates. In Condition 3, the "water contact angle of the surface of the resin layer" refers to a water contact angle of the surface of the resin layer before the steel wool abrasion test is performed.

In the laminated film, a water contact angle of the surface of the resin layer, or one of the resin layers when the resin layers are laminated on both surfaces of the support, as described above, is 95° or greater, preferably 96° or greater, more preferably 97° or greater, even more preferably 98° or greater, yet even more preferably 99° or greater, yet even more preferably 100° or greater, yet even more preferably 101° or greater, yet even more preferably 102° or greater, yet even more preferably 103° or greater, yet even more preferably 104° or greater, yet even more preferably 105° or greater, yet even more preferably 106° or greater, yet even more preferably 107° or greater, yet even more preferably 108° or greater, yet even more preferably 109° or greater, and yet even more preferably 110° or greater. When the water contact angle of the surface of the resin layer is less than 95°, the antifouling properties of the laminated film are insufficient, and it may be difficult to use the laminated film as a surface protective material for a flexible device.

Note that, in the laminated film, when the resin layers are laminated on both surfaces of the support, the water contact angle of the surface of one of the resin layers may be 95° or greater, and the water contact angle of the other resin layer is not limited, and may be 95° or greater or less than 95°.

In the laminated film, a water contact angle on the tested areas of the surface of the resin layer after subjected to a steel wool abrasion test where the surface of the resin layer is rubbed back and forth 1000 times with #0000 steel wool while a load of 1 kg/cm$^2$ is applied (the water contact angle may be hereinafter referred to as "water contact angle after subjected to a steel wool abrasion test"), as described above, is 90° or greater, preferably 91° or greater, more preferably 92° or greater, even more preferably 93° or greater, yet even more preferably 94° or greater, yet even more preferably 95° or greater, yet even more preferably 96° or greater, yet even more preferably 97° or greater, yet even more preferably 98° or greater, yet even more preferably 99° or greater, yet even more preferably 100° or greater, yet even more preferably 101° or greater, yet even more preferably 102° or greater, yet even more preferably 103° or greater, yet even more preferably 104° or greater, yet even more preferably 105° or greater, yet even more preferably 106° or greater, yet even more preferably 107° or greater, and yet even more preferably 108° or greater. When the water contact angle after the steel wool abrasion test is less than 90°, the durability of the antifouling performance of the laminated film is insufficient. In a case where the laminated film is used as a surface protective material for a flexible device, the antifouling performance may be deteriorated by repetitive touch operations.

Preferably, in the laminated film, the resin layer, or one of the resin layers when the resin layers are laminated on both surfaces of the support, further satisfies the following Condition (Condition 4):

Condition 4: in the following bending resistance test, a number of operations it takes for cracks to occur in the resin layer is 10000 times or more:

bending resistance test:

when an operation of bending the laminated film from an unbent state to a direction where the surface of the resin layer is bent by 180° into a convex shape with a curvature radius (R) of 4.0 mm and unbending the bent laminated film again is defined as one cycle, the operation is performed at a rate of 30 to 60 cycles/min.

In the present specification, the bending resistance test and the bending resistance in Condition 4 may be referred to as "bending resistance test (2)" and "bending resistance (2)", respectively.

Note that, in the laminated film, when the resin layers are laminated on both surfaces of the support, one of the resin layers may satisfy Condition 4, and the other resin layer may or may not satisfy Condition 4.

Condition 4 indicates that the laminated film has excellent bending resistance, i.e., characteristics in which defects such as cracks hardly occur in the resin layer even when the laminated film is repeatedly folded. Specifically, it is a condition indicating that the laminated film has excellent durability (bending resistance (2)) when the laminated film is repeatedly folded to cause the surface of the resin layer to be bent into a convex shape (outward).

Figure 3:
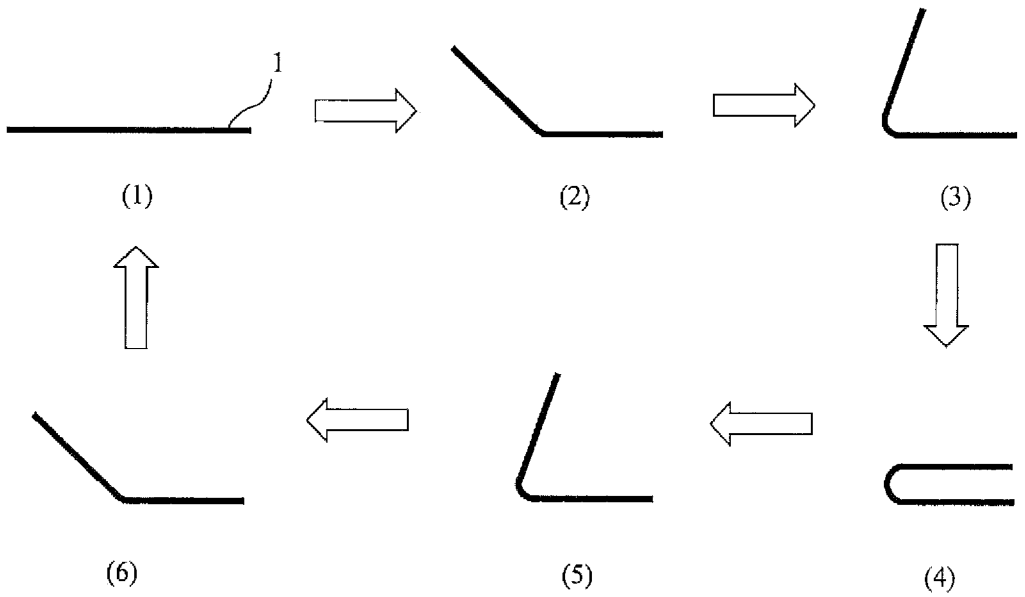
FIG. 3 is a schematic view (side view) illustrating a test method (R bending method) of bending resistance in the present disclosure (one operation of bending the laminated film by 180° with a curvature radius (R) of 2.5 mm or 4.0 mm in a direction in which the surface of the resin layer is bent into a concave or convex shape, and then unbending the bent film) in the present disclosure.
Figure 4:
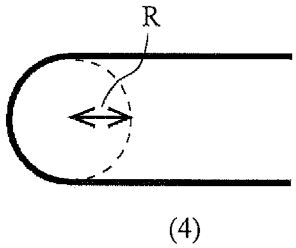
FIG. 4 is an enlarged view of (4) in FIG. 3.

FIG. 3 is a schematic view (side view) illustrating one operation of bending the laminated film from an unbent state to a direction (not illustrated) where the surface of the resin layer is bent by 180° into a convex shape (outward) with a curvature radius (R) of 4.0 mm and unbending the bent laminated film again in the bending resistance test (2) shown in Condition 4 above. FIG. 4 is an enlarged view of (4) in FIG. 3, where R represents a curvature radius. The bending resistance test (2) can be performed using a cylindrical mandrel with a radius of 4.0 mm.

The bending resistance (2) of the laminated film is such bending resistance that allows the laminated film to be subjected to the operation for 10000 times or more, more preferably 20000 times or more, even more preferably 30000 times or more, yet even more preferably 40000 times or more, yet even more preferably 50000 times or more, yet even more preferably 60000 times or more, yet even more preferably 70000 times or more, yet even more preferably 80000 times or more, yet even more preferably 90000 times or more, yet even more preferably 100000 times or more, yet even more preferably 150000 times or more, and particularly preferably 200000 times or more. When the bending resistance (2) is such bending resistance that allows the laminated film to be subjected to the operation for less than 10000 times, the bending resistance (2) of the laminated film is insufficient, and thus it may be difficult to use the laminated film as a surface protective material for a flexible device (in particular, a display device or the like that is bent outward).

Preferably, in the laminated film, the resin layer, or one of the resin layers when the resin layers are laminated on both surfaces of the support, further satisfies the following Condition (Condition 5):

Condition 5: no scratches are visually observed in a steel wool abrasion test where the surface of the resin layer is rubbed back and forth 1000 times with #0000 steel wool while a load of 1 kg/$cm^2$ is applied (which may be hereinafter referred to as, for example, "scratch resistance that allows the laminated film to be subjected to the operation 1000 times or more").

Note that, in the laminated film, when the resin layers are laminated on both surfaces of the support, one of the resin layers may satisfy Condition 5, and the other resin layer may or may not satisfy Condition 5.

Condition 5 above indicates that the laminated film has excellent scratch resistance. The scratch resistance of the laminated film is such scratch resistance that allows the laminated film to be subjected to the operation for 1000 times or more, preferably 2000 times or more, more preferably 3000 times or more, even more preferably 4000 times or more, yet even more preferably 5000 times or more, yet even more preferably 6000 times or more, yet even more preferably 7000 times or more, yet even more preferably 8000 times or more, yet even more preferably 9000 times or more, and yet even more preferably 10000 times or more. When the scratch resistance is such scratch resistance that allows the laminated film to be subjected to the operation for less than 1000 times, the scratch resistance of the laminated film is insufficient and it may be difficult to use the laminated film as a surface protective material for a flexible device.

Preferably, in the laminated film, the resin layer, or one of the resin layers when the resin layers are laminated on both surfaces of the support, further satisfies the following Condition (Condition 6):

Condition 6: in the following bending resistance test, a number of operations it takes for cracks to occur in the resin layer is 50000 times or more:

bending resistance test:

when an operation of bending the laminated film from an unbent state to a direction where the surface of the resin layer is bent by 180° into a concave shape with a curvature radius (R) of 2.5 mm and unbending the bent laminated film again is defined as one cycle, the operation is performed at a rate of 30 to 60 cycles/min.

In the present specification, the bending resistance test and the bending resistance in Condition 6 may be referred to as "bending resistance test (1)" and "bending resistance (1)", respectively.

Note that, in the laminated film, when the resin layers are laminated on both surfaces of the support, one of the resin layers may satisfy Condition 6, and the other resin layer may or may not satisfy Condition 6.

Condition 6 above indicates that the laminate film has bending resistance (bending resistance (1)) when the surface of the resin layer is repeatedly bent into a concave shape (inward) in the above-described bending resistance of the laminated film. In the bending resistance test (1) for the bending resistance (1), the measurement can be performed under the same conditions as in the bending resistance test (2) except that the surface of the resin layer is bent into a concave shape (inward) and the curvature radius (R) is 2.5 mm.

The bending resistance (1) of the laminated film is such bending resistance that allows the laminated film to be subjected to the operation for 50000 times or more, preferably 60000 times or more, more preferably 70000 times or more, even more preferably 80000 times or more, yet even more preferably 90000 times or more, yet even more preferably 100000 times or more, yet even more preferably 150000 times or more, and particularly preferably 200000 times or more. When the bending resistance (1) is such bending resistance that allows the laminated film to be subjected to the operation for less than 50000 times, the bending resistance (1) of the laminated film is insufficient, and thus it may be difficult to use the laminated film as a surface protective material for a flexible device (in particular, a display device or the like that is bent inward).

Preferably, in the laminated film, the resin layer, or one of the resin layers when the resin layers are laminated on both surfaces of the support, further satisfies the following Condition (Condition 7):

Condition 7: in a cylindrical mandrel test specified in JIS K5600-5-1 (1999) where the surface of the resin layer of the laminated film is bent into a concave shape with a curvature radius of 5 mm, no cracks occur on the surface of the resin layer.

Note that, in the laminated film, when the resin layers are laminated on both surfaces of the support, one of the resin layers may satisfy Condition 7, and the other resin layer may or may not satisfy Condition 7.

Condition 7 above indicates that the laminated film has excellent bendability, and specifically, a condition indicating that the laminated film has excellent bendability (which may be hereinafter referred to as "bendability (1)") when the resin layer is bent into a concave shape (inward).

Regarding the bendability (1), the curvature radius is 5 mm or less, preferably 4.5 mm or less, more preferably 4.0 mm or less, even more preferably 3.5 mm or less, yet even more preferably 3.0 mm or less, yet even more preferably 2.5 mm or less, and particularly preferably 2.0 mm or less. When the curvature radius is greater than 5 mm, the bendability of the laminated film is insufficient, and thus it may be difficult to use the laminated film as a surface protective material for a flexible device (in particular, a display device or the like that is bent outward).

The laminated film includes a support and a resin layer formed on a surface of the support. The resin layer may be formed only on a portion of the surface of the support, or may be formed over the entire surface of the support. The laminated film may have one, or two or more other layers in addition to the support and the resin layer. Examples of those other layers include an anchor layer, an adhesive layer, a low reflection layer, an antifouling layer, a water-repellent layer, an oil-repellent layer, an antifogging layer, a protective film layer, a print layer, a conductive layer, an electromagnetic wave shielding layer, an ultraviolet absorbing layer, an infrared absorbing layer, and a blue light blocking layer.

A haze of the laminated film is, for example, 7% or less, preferably 6% or less, more preferably 5% or less, even more preferably 4% or less, yet even more preferably 3% or less, yet even more preferably 2% or less, yet even more preferably 1.5% or less, and yet even more preferably 1.3% or less. Here, the lower limit of the haze is not particularly limited and is, for example, 0.1%. The laminated film with a haze particularly of 7% or less tends to be suitable for use, for example, in applications requiring very high transparency (e.g., a surface protection sheet for a display such as a touch screen). In the present specification, the haze can be measured in accordance with JIS K7136.

The total light transmittance of the laminated film is, for example, 85% or greater, preferably 90% or greater. When the total light transmittance is set to 90% or greater, for example, the present invention tends to be suitable for use, for example, in applications requiring very high transparency (for example, as a surface protection sheet of a display of a touch panel). In the present specification, the total light transmittance can be measured in accordance with JIS K7361-1.

The thickness of the laminated film (the total thickness of the support/resin layer) can be appropriately selected from the range of, for example, 1 to 10000 μm, and is preferably from 10 to 1000 μm, more preferably from 15 to 800 μm, even more preferably from 20 to 700 μm, and particularly preferably from 30 to 500 μm.

The laminated film having the above-described performance can be produced by selecting the materials for the support and controlling the thickness of the support, as described below, and controlling the components and thickness of the resin layer and the method of laminating the resin layer on the support.

Support

The support in the laminated film is not particularly limited, and a known or commonly used support can be used, such as a plastic substrate, a metal substrate, a ceramic substrate, a semiconductor substrate, a glass substrate, a paper substrate, a wood substrate (wooden substrate), and a substrate having a surface that is a coated surface. Among them, a plastic substrate is preferred. The support may have a single layer configuration, or may have a multilayer (laminated) configuration, and the configuration (structure) thereof is not particularly limited.

The plastic material constituting the plastic substrate is not particularly limited. Examples thereof include various plastic materials, such as polyesters, such as polyethylene terephthalate (PET) and polyethylene naphthalate (PEN); polyimides; polycarbonates; polyamides; polyacetals; polyphenylene oxides; polyphenylene sulfides; polyethersulfones; polyetheretherketones; cyclic polyolefins, such as homopolymers of norbornene-based monomers (such as addition polymers and ring-opened polymers), copolymers of a norbornene-based monomer and an olefin-based monomer (such as cyclic olefin copolymers, such as addition polymers and ring-opened polymers), such as a copolymer of norbornene and ethylene, and derivatives thereof; vinyl-based polymers (for example, acrylic resins, such as polymethyl methacrylates (PMMA), polystyrenes, polyvinyl chlorides, and acrylonitrile-styrene-butadiene resins (ABS resins)); vinylidene polymers (for example, such as polyvinylidene chlorides); cellulose resins, such as triacetyl cellulose (TAC); epoxy resins; phenolic resins; melamine resins; urea resins; maleimide resins; and silicones. Here, the above plastic substrate may be constituted of only one type of plastic material or may be constituted of two or more types of plastic materials.

Among the above plastic substrates, when the object is to obtain a laminated film excellent in transparency and bending resistance, a support excellent in transparency and bending resistance (transparent support) is preferably used. More preferably, a polyester film (in particular, PET and PEN), a polyimide film, a cyclic polyolefin film, a polycarbonate film, a TAC film, or a PMMA film is used. Even more preferably, a polyester film (in particular, PET and PEN) or a polyimide film is used.

The support (in particular, a plastic substrate) may contain an additional additive as necessary, such as an antioxidant, an ultraviolet absorber, a light-resistant stabilizer, a thermal stabilizer, a crystal nucleating agent, a flame retardant, a flame retardant auxiliary, a filler, a plasticizer, an impact modifier, a reinforcing agent, a dispersant, an antistatic agent, a foaming agent, and an antibacterial agent. Here, one type of the additive can be used alone, or two or more types thereof can be used in combination.

A known or commonly used surface treatment such as roughening treatment, adhesion-facilitating treatment, antistatic treatment, sand blast treatment (sand mat treatment), corona discharge treatment, plasma treatment, chemical etching treatment, water mat treatment, flame treatment, acid treatment, alkali treatment, oxidation treatment, ultraviolet irradiation treatment, and silane coupling agent treatment may be applied to part or all of the surface of the support (in particular, a plastic substrate). Here, the plastic substrate may be an unstretched film or a stretched film (such as a uniaxially stretched film and a biaxially stretched film). In addition, a commercially available support can be also used as the support.

The thickness of the support is, for example, from about 1 to 1000 μm, preferably from 5 to 500 μm, more preferably from 10 to 400 μm, even more preferably from 15 to 400 μm, yet even more preferably from 20 to 300 μm, and particularly preferably from 25 to 200 μm.

The haze of the support according to the present disclosure is, for example, 7% or less, preferably 6% or less, more preferably 5% or less, even more preferably 4% or less, yet even more preferably 3% or less, particularly preferably 2% or less, and most preferably 1% or less. Here, the lower limit of the haze is, for example, 0.1%. The laminated film with a haze particularly of 7% or less tends to be suitable for use, for example, in applications requiring very high transparency (e.g., a surface protection sheet for a display such as a touch screen).

The total light transmittance of the support according to the present disclosure is, for example, 85% or greater, preferably 90% or greater. When the total light transmittance is set to 90% or greater, for example, the present invention tends to be suitable for use, for example, in applications requiring very high transparency (for example, as a surface protection sheet of a display of a touch panel).

Resin Layer

The resin layer according to the present disclosure is formed of a cured product of a curable composition described below. That is, the resin layer includes a cured product formed of the curable composition, and it is preferably a layer that satisfies Conditions 1, 2, and 3, and further satisfies at least one condition selected from Conditions 4, 5, 6, and 7. The resin layer can be produced by, for example, a method for producing a laminated film described below.

The thickness of the resin layer is, in terms of the surface hardness and the scratch resistance, for example, from 1 to 100 μm, preferably from 2 to 80 μm, more preferably from 3 to 60 μm, even more preferably from 5 to 50 μm, and most preferably from 10 to 40 μm. When the thickness of the resin layer is less than 1 μm, a high level of surface hardness may not be maintained. Further, when the thickness of the resin layer is greater than 100 μm, defects, such as deterioration in bendability and occurrence of large curling, are likely to occur.

The haze of the resin layer is, for example, 1.0 or less, preferably 0.5% or less, and more preferably 0.1% or less. Here, the lower limit of the haze of the resin layer is not particularly limited and is, for example, 0.1%. The resin layer with a haze particularly of 1.0% or less tends to be suitable for use, for example, in applications requiring very high transparency (e.g., a surface protection sheet for a display such as a touch screen). The haze of the resin layer can be determined by a difference obtained by subtracting the haze of the support from the haze of the laminated film (support/resin layer) described above.

The total light transmittance of the resin layer is, for example, 85% or greater, preferably 90% or greater. When the total light transmittance is set to 85% or greater, for example, the present invention tends to be suitable for use, for example, in applications requiring very high transparency (for example, as a surface protection sheet of a display of a touch panel). The total light transmittance of the resin layer can be determined, for example, by applying the curable composition described above to a release substrate in such a manner that the thickness after curing the curable composition is the same as the thickness of the resin layer of the laminated film, curing the curable composition, peeling off the cured film, and then measuring the film in accordance with JIS K 7361-1.

The resin layer also has excellent surface smoothness, and the arithmetic average roughness $R_a$ in the method in accordance with JIS B0601 is, for example, from 0.1 to 20 nm, preferably from 0.1 to 10 nm, and more preferably from 0.1 to 5 nm.

The resin layer may be laminated on only one surface of the support or may be laminated on both surfaces of the support. When the resin layers are laminated on both surfaces of the support, the resin layers may each be the same or different. When the resin layers are laminated on both surfaces of the support, one of the resin layers may satisfy Conditions 1, 2, and 3, and preferably may satisfy Conditions 4, 5, 6, and/or 7, and the other resin layer may or may not satisfy one or more of Conditions 1 to 7.

Curable Composition

The curable composition for forming the resin layer of the laminated film contains one or more curable compounds.

Examples of the curable compound include a (meth) acrylate compound, a cationically curable silicone resin, an epoxy resin, a melamine resin, a vinyl ether resin, and an oxetane resin.

From the perspective of forming a resin layer satisfying the above-described performance (Conditions 1, 2, and 3, preferably Conditions 4, 5, 6, and/or 7) in the laminated film, the curable composition is preferably a composition containing a cationically curable compound as the curable compound, particularly preferably a composition containing a cationically curable silicone resin, and especially preferably a curable composition (which may be hereinafter referred to as "curable composition according to present disclosure) containing polyorganosilsesquioxane having a cationically polymerizable functional group (which may be hereinafter referred to as "polyorganosilsesquioxane according to present disclosure).

The curable composition according to the present disclosure may further contain an additional component such as a curing catalyst (particularly, a cationic polymerization initiator or a radical polymerization initiator), a compound having one or more thermally polymerizable functional groups and one or more photopolymerizable functional groups in a molecule, an aliphatic compound having two or more thermally polymerizable functional groups in a molecule, a fluorine-containing photopolymerizable resin, a surface conditioner, or a surface modifier.

The curable composition according to the present disclosure may further contain an additional component such as a curing catalyst (particularly, a cationic polymerization initiator or a radical polymerization initiator), a compound having one or more cationically polymerizable groups and one or more radically polymerizable groups in the molecule, an aliphatic compound having two or more cationically polymerizable groups in a molecule, a fluorine-containing radically polymerizable compound, a surface conditioner, or a surface modifier.

Polyorganosilsesquioxane

The polyorganosilsesquioxane according to the present disclosure includes at least a constituent unit represented by Formula (I) below (which may be hereinafter referred to as "T3 form"). Preferably, the polyorganosilsesquioxane according to the present disclosure further includes a constituent unit represented by Formula (II) below (which may be hereinafter referred to as "T2 form").

[Chem. 1]

$$[R^aSiO_{3/2}] \quad (I)$$

$R^a$ in Formula (I) represents a group containing a cationically polymerizable functional group, a substituted or unsubstituted aryl group, a substituted or unsubstituted aralkyl group, a substituted or unsubstituted cycloalkyl group, a substituted or unsubstituted alkyl group, a substituted or unsubstituted alkenyl group, or a hydrogen atom.

[Chem. 2]

$$[R^bSiO_{2/2}(OR^c)] \quad (II)$$

$R^b$ in Formula (II) represents a group containing a cationically polymerizable functional group, a substituted or unsubstituted aryl group, a substituted or unsubstituted aralkyl group, a substituted or unsubstituted cycloalkyl group, a substituted or unsubstituted alkyl group, a substituted or unsubstituted alkenyl group, or a hydrogen atom. $R^c$ represents a hydrogen atom or an alkyl group having from 1 to 4 carbons.

A more detailed description of the constituent unit represented by the Formula (I) above is represented by the following Formula (I'). Furthermore, the constituent unit represented by Formula (II) above is represented by Formula (II') below when described in greater detail. $R^a$, $R^b$, and $R^c$ in Formulae (I') and (II') below are the same as those described above. Three oxygen atoms bonded to the silicon atom illustrated in the structure represented by Formula (I') below are each bonded to another silicon atom (a silicon atom not illustrated in Formula (I')). On the other hand, two oxygen atoms located above and below the silicon atom illustrated in the structure represented by Formula (II') below are each bonded to another silicon atom (a silicon atom not illustrated in Formula (II')). That is, both the T3 form and the T2 form are constituent units (T units) formed by a hydrolysis and condensation reaction of a corresponding hydrolyzable trifunctional silane compound.

[Chem. 3]

(I')

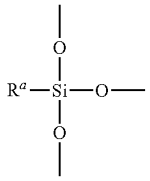

-continued

[Chem. 4]

(II')

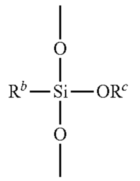

$R^a$ in Formula (I) above (likewise, $R^a$ in Formula (I')) and $R^b$ in Formula (II) above (likewise, $R^b$ in Formula (II')) each represent a group containing a cationically polymerizable functional group, a substituted or unsubstituted aryl group, a substituted or unsubstituted aralkyl group, a substituted or unsubstituted cycloalkyl group, a substituted or unsubstituted alkyl group, a substituted or unsubstituted alkenyl group, or a hydrogen atom.

Specific examples of $R^a$ and $R^b$ include the same examples as those given for $R^1$ in Formula (1) and $R^2$ in Formula (2) as described below. Note that $R^a$ in Formula (I) and $R^b$ in Formula (II) are each derived from a group (a group other than an alkoxy group and a halogen atom; for example, $R^1$, $R^2$, and a hydrogen atom in Formulae (a) to (c) described below) bonded to a silicon atom in the hydrolyzable trifunctional silane compound used as a raw material for the polyorganosilsesquioxane according to the present disclosure.

$R^c$ in Formula (II) above (likewise, $R^c$ in Formula (II')) represents a hydrogen atom or an alkyl group having from 1 to 4 carbons. Examples of the alkyl group having from 1 to 4 carbons include linear or branched alkyl groups having from 1 to 4 carbons, such as a methyl group, an ethyl group, a propyl group, an isopropyl group, a butyl group, and an isobutyl group. The alkyl group in $R^c$ in Formula (II) is typically derived from an alkyl group that forms an alkoxy group (e.g., an alkoxy group as $X^1$ to $X^3$ as described below) in the hydrolyzable silane compound used as a raw material for the polyorganosilsesquioxane according to the present disclosure.

When the polyorganosilsesquioxane according to the present disclosure has a constituent unit (T3 form) represented by Formula (I) above and a constituent unit (T2 form) represented by Formula (II) above, the [T3 form/T2 form] molar ratio is not particularly limited, and for example, can be appropriately selected from a range of 5 or greater (for example, from 5 to 500). The lower limit of the [T3 form/T2 form] ratio of the polyorganosilsesquioxane according to the present disclosure is preferably more preferably 6, and even more preferably 7, and the upper limit is preferably less than 20, more preferably 18, even more preferably 16, and yet even more preferably 14. When the above [T3 form/T2 form] ratio is set to 5 or greater, the surface hardness of the resin layer tends to be improved. When the above-described [T3 form/T2 form] ratio is set to less than 20 (preferably 18 or less), miscibility with other components in the curable composition is improved, and viscosity is suppressed, and therefore handling is simplified, and coating is facilitated.

The lower limit of the [T3 form/T2 form] ratio in the polyorganosilsesquioxane according to another embodiment of the present disclosure is preferably 20, more preferably 21, even more preferably 23, and yet even more preferably 25, and the upper limit is preferably 500, more preferably 100, even more preferably 50, and yet even more preferably 40. When the above-described [T3 form/T2 form] ratio is set to 20 or greater, in addition to the improvement in surface hardness and adhesibility, the surface when formed as an uncured or semi-cured resin layer tends to be tack-free, blocking resistance is improved, and winding of the resin layer onto a roll is facilitated. On the other hand, when the above-described [T3 form/T2 form] ratio is set to 500 or less, miscibility with other components in the curable composition is improved, and viscosity is suppressed, and therefore handling is simplified, and coating is facilitated.

The above-mentioned ratio [T3 units/T2 units] in the polyorganosilsesquioxane according to the present disclosure can be determined, for example, by $^{29}$Si-NMR spectroscopic analysis. In the $^{29}$Si-NMR spectrum, the silicon atoms in the constituent units represented by Formula (I) above (T3 units) and the silicon atoms in the constituent units represented by Formula (II) above (T2 units) exhibit signals (peaks) at different positions (chemical shifts), and thus the above-mentioned ratio [T3 units/T2 units] can be determined by calculating the integration ratio of each of these peaks. Specifically, for example, when the polyorganosilsesquioxane according to the present disclosure includes constituent units represented by Formulae (I) and (II) above, where $R^a$ and $R^b$ each are a 2-(3',4'-epoxycyclohexyl)ethyl group, the signal of the silicon atom in the structure (T3 form) represented by Formula (I) above appears at −64 to −70 ppm, and the signal of the silicon atom in the structure (T2 form) represented by Formula (II) above appears at −54 to −60 ppm. Thus, in this case, the above [T3 form/T2 form] ratio can be determined by calculating the integration ratio of the signal at −64 to −70 ppm (T3 form) and the signal at −54 to −60 ppm (T2 form). For a case in which $R^a$ and $R^b$ each are a group that includes a cationically polymerizable functional group other than the 2-(3',4'-epoxycyclohexyl) ethyl group, the [T3 form/T2 form] ratio can be determined in the same manner.

The $^{29}$Si-NMR spectrum of the polyorganosilsesquioxane according to the present disclosure can be measured, for example, by using the following instrument under the following conditions.

Measurement instrument: "JNM-ECA500NMR" (trade name, available from JEOL Ltd.)
Solvent: deuterochloroform
Cumulative number: 1800 times
Measurement temperature: 25° C.

The [T3 form/T2 form] ratio of the polyorganosilsesquioxane according to the present disclosure that is within the above-mentioned range (for example, from 5 to 500) indicates that a certain amount of the T2 form is present relative to the amount of the T3 form in the polyorganosilsesquioxane according to the present disclosure.

The polyorganosilsesquioxane according to the present disclosure includes, as a T3 form, at least a constituent unit represented by Formula (I) above, where $R^a$ in Formula (I) is a group containing a cationically polymerizable functional group (=constituent unit represented by Formula (1) described below).

The polyorganosilsesquioxane according to the present disclosure includes, as the T3 form, a constituent unit represented by Formula (1) below.

[Chem. 5]

$$[R^1SiO_{3/2}] \tag{1}$$

$R^1$ in Formula (1) represents a group containing a cationically polymerizable functional group.

The polyorganosilsesquioxane according to the present disclosure may include only one type of constituent unit represented by Formula (1) above or may include two or more types of constituent units represented by Formula (1) above.

The polyorganosilsesquioxane according to the present disclosure may also include, as a T3 form, a constituent unit represented by Formula (2) below, in addition to the constituent unit represented by Formula (1) above.

[Chem. 6]

$$[R^2SiO_{3/2}] \quad (2)$$

$R^2$ in Formula (2) represents a substituted or unsubstituted aryl group, a substituted or unsubstituted aralkyl group, a substituted or unsubstituted cycloalkyl group, a substituted or unsubstituted alkyl group, or a substituted or unsubstituted alkenyl group.

The polyorganosilsesquioxane according to the present disclosure may also include, for example, a constituent unit represented by Formula (3) below, as a T3 form, in addition to the constituent unit represented by Formula (1) above and the constituent unit represented by Formula (2) above.

[Chem. 7]

$$[HSiO_{3/2}] \quad (3)$$

In addition, it is preferable that the polyorganosilsesquioxane according to the present disclosure further includes, as a T2 form, a constituent unit represented by Formula (II), where $R^b$ in Formula (II) is a group containing a cationically polymerizable functional group.

The polyorganosilsesquioxane according to the present disclosure preferably includes, as the T2 form, a constituent unit represented by Formula (4) below.

[Chem. 8]

$$[R^1SiO_{2/2}(OR^c)] \quad (4)$$

The polyorganosilsesquioxane according to the present disclosure may also include, as T2 forms, constituent units represented by Formulae (5) and (6) below, in addition to the constituent unit represented by Formula (4) above.

[Chem. 9]

$$[R^2SiO_{2/2}(OR^c)] \quad (5)$$

[Chem. 10]

$$[HSiO_{2/2}(OR^c)] \quad (6)$$

$R^1$ in Formula (4) above and $R^2$ in Formula (5) above are the same as $R^1$ in Formula (1) above and $R^2$ in Formula (2) above, respectively. $R^c$ in Formulae (4) to (6) above is the same as $R^c$ in Formula (II).

Furthermore, the polyorganosilsesquioxane according to the present disclosure may include a T form other than the T3 form and the T2 form, or may include at least one type of siloxane constituent unit selected from the group consisting of an M unit, a D unit, and a Q unit, in addition to the T unit.

$R^1$ in Formula (1) represents a group (monovalent group) containing a cationically polymerizable functional group.

The "cationically polymerizable functional group" in the group containing a cationically polymerizable functional group is not particularly limited as long as it has cationic polymerizability, and examples thereof include an epoxy group, an oxetane group, a vinyl ether group, and a vinyl phenyl group. As the cationically polymerizable functional group, an epoxy group is particularly preferred from the perspective of the surface hardness (e.g., F or greater) of the resin layer.

The group containing a cationically polymerizable functional group is preferably a group containing an epoxy group (or a group having an oxirane ring), and is not particularly limited. From the perspectives of the curability of the curable composition and the surface hardness and heat resistance of the cured product (resin layer), a group represented by Formula (1a) below, a group represented by Formula (1b) below, a group represented by Formula (1c) below, and a group represented by Formula (1d) below are preferred, a group represented by Formula (1a), a group represented by Formula (1c) below, and a group represented by Formula (1a) below are more preferred.

[Chem. 11]

(1a)

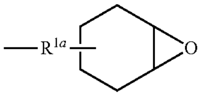

[Chem. 12]

(1b)

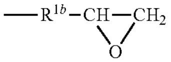

[Chem. 13]

(1c)

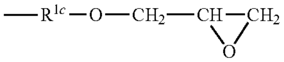

[Chem. 14]

(1d)

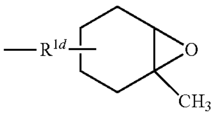

In Formula (1a) above, $R^{1a}$ represents a linear or branched alkylene group. Examples of the linear or branched alkylene group include linear or branched alkylene groups having from 1 to 10 carbons, such as a methylene group, a methyl methylene group, a dimethyl methylene group, an ethylene group, a propylene group, a trimethylene group, a tetramethylene group, a pentamethylene group, a hexamethylene group, and a decamethylene group. Among these, from the perspective of surface hardness of the cured product (resin layer) or curability, $R^{1a}$ is preferably a linear alkylene group having from 1 to 4 carbons or a branched alkylene group having 3 or 4 carbons, more preferably an ethylene group, a trimethylene group, or a propylene group, and even more preferably an ethylene group or a trimethylene group.

In Formula (1b) above, $R^{1b}$ represents a linear or branched alkylene group, and examples thereof include the same groups listed as examples of $R^{1a}$. Among these, from the perspective of surface hardness of the cured product (resin layer) or curability, $R^{1b}$ is preferably a linear alkylene group having from 1 to 4 carbons or a branched alkylene group having 3 or 4 carbons, more preferably an ethylene group, a trimethylene group, or a propylene group, and even more preferably an ethylene group or a trimethylene group.

In Formula (1c) above, $R^{1c}$ represents a linear or branched alkylene group, and examples thereof include the same groups listed as examples of $R^{1a}$. Among these, from the perspective of surface hardness of the cured product (resin layer) or curability, $R^{1c}$ is preferably a linear alkylene group having from 1 to 4 carbons or a branched alkylene group having 3 or 4 carbons, more preferably an ethylene group, a trimethylene group, or a propylene group, and even more preferably an ethylene group or a trimethylene group.

In Formula (1d) above, $R^{1d}$ represents a linear or branched alkylene group, and examples thereof include the same groups listed as examples of $R^{1a}$. Among these, from the perspective of surface hardness of the cured product (resin layer) or curability, $R^{1d}$ is preferably a linear alkylene group having from 1 to 4 carbons or a branched alkylene group having 3 or 4 carbons, more preferably an ethylene group, a trimethylene group, or a propylene group, and even more preferably an ethylene group or a trimethylene group.

$R^1$ in Formula (1) is particularly preferably a group represented by Formula (1a) above, in which $R^{1a}$ is an ethylene group (among which a 2-(3',4'-epoxycyclohexyl) ethyl group is preferred).

The group containing an oxetane group is not particularly limited, and examples thereof include known or commonly used groups having an oxetane ring, including, for example, an oxetane group, and groups obtained by replacing a hydrogen atom (ordinarily one or more, preferably one hydrogen atom) of an alkyl group (alkyl group having preferably from 1 to 10 carbons, and more preferably from 1 to 5 carbons) with an oxetane group. From the perspectives of curability of the curable composition and heat resistance of the cured product (resin layer), a 3-oxetanyl group, an oxetan-3-yl methyl group, a 3-ethyloxetan-3-yl methyl group, a 2-(oxetan-3-yl)ethyl group, a 2-(3-ethyloxetan-3-yl)ethyl group, a 3-(oxetan-3-yl methoxy)propyl group, and a 3-(3-ethyloxetan-3-yl-methoxy)propyl group are preferred.

The group containing a vinyl ether group is not particularly limited, and examples thereof include known or commonly used groups having a vinyl ether group, including, for example, a vinyl ether group; and groups obtained by replacing a hydrogen atom (ordinarily one or more, preferably one hydrogen atom) of an alkyl group (alkyl group having preferably from 1 to 10 carbons, and more preferably from 1 to 5 carbons) with a vinyl ether group. From the perspectives of curability of the curable composition and heat resistance of the cured product (resin layer), a vinyloxy methyl group, a 2-(vinyloxy)ethyl group, and a 3-(vinyloxy) propyl group, and the like are preferred.

The group containing a vinyl phenyl group is not particularly limited, and examples thereof include known or commonly used groups having a vinyl phenyl group, including, for example, a vinyl phenyl group; and groups obtained by replacing a hydrogen atom (ordinarily one or more, preferably one hydrogen atom) of an alkyl group (alkyl group having preferably from 1 to 10 carbons, and more preferably from 1 to 5 carbons) with a vinyl phenyl group. From the perspectives of curability of the curable composition and heat resistance of the cured product (resin layer), a 4-vinylphenyl group, a 3-vinylphenyl group, a 2-vinylphenyl group, and the like, are preferred.

$R^2$ in Formula (2) represents a substituted or unsubstituted aryl group, a substituted or unsubstituted aralkyl group, a substituted or unsubstituted cycloalkyl group, a substituted or unsubstituted alkyl group, or a substituted or unsubstituted alkenyl group. Examples of the aryl group include a phenyl group, a tolyl group, and a naphthyl group. Examples of the aralkyl group include a benzyl group and a phenethyl group. Examples of the cycloalkyl group include a cyclobutyl group, a cyclopentyl group, and a cyclohexyl group. Examples of the alkyl group include linear or branched alkyl groups, such as a methyl group, an ethyl group, a propyl group, an n-butyl group, an isopropyl group, an isobutyl group, an s-butyl group, a t-butyl group, and an isopentyl group. Examples of the alkenyl group include linear or branched alkenyl groups, such as a vinyl group, an allyl group, and an isopropenyl group.

Examples of the substituted aryl group, the substituted aralkyl group, the substituted cycloalkyl group, the substituted alkyl group, and the substituted alkenyl group described above include a group in which some or all of hydrogen atoms or a portion or the entirety of the skeleton in each of the aryl group, the aralkyl group, the cycloalkyl group, the alkyl group, and the alkenyl group described above are substituted with at least one type selected from the group consisting of an ether group, an ester group, a carbonyl group, a siloxane group, a halogen atom (such as a fluorine atom), an acryl group, a methacryl group, a mercapto group, an amino group, and a hydroxyl group (hydroxyl group).

Among these, $R^2$ is preferably a substituted or unsubstituted aryl group, a substituted or unsubstituted alkyl group, or a substituted or unsubstituted alkenyl group, more preferably a substituted or unsubstituted aryl group, and even more preferably a phenyl group.

Each silsesquioxane constituent unit constituting the polyorganosilsesquioxane according to the present disclosure is formed by a hydrolysis and condensation reaction of a corresponding hydrolyzable trifunctional silane compound.

A ratio of each silsesquioxane constituent unit constituting the polyorganosilsesquioxane according to the present disclosure can be appropriately adjusted by a composition of the raw materials (hydrolyzable trifunctional silanes) for forming these constituent units.

The polyorganosilsesquioxane according to the present disclosure may have any of a cage-type, an incomplete cage-type, a ladder-type, or a random-type silsesquioxane structure, or may have a combination of two or more of these silsesquioxane structures.

If the polyorganosilsesquioxane according to the present disclosure has a constituent unit represented by Formula (4) above, a ratio (total amount) of the constituent unit represented by Formula (1) above and the constituent unit represented by Formula (4) above to a total amount (100 mol %) of siloxane constituent units [all siloxane constituent units; total amount of M units, D units, T units, and Q units] is not particularly limited, but is preferably from 55 to 100 mol %, more preferably from 65 to 100 mol %, and even more preferably from 80 to 99 mol %. When the above ratio is set to 55 mol % or greater, the curability of the curable composition improves, and the surface hardness and adhesiveness of the cured product (resin layer) significantly increase. In addition, the ratio of each siloxane constituent unit in the polyorganosilsesquioxane according to the present disclosure can be calculated, for example, from the composition of the raw materials and NMR spectroscopic measurements.

The ratio (total amount) of the constituent unit represented by Formula (2) above and the constituent unit represented by Formula (5) above relative to a total amount (100 mol %) of siloxane constituent units [all siloxane constituent units; total amount of M unit, D unit, T unit, and Q unit] in the polyorganosilsesquioxane according to the present disclosure is not particularly limited, but is preferably from 0 to 70 mol %, more preferably from 0 to 60 mol %, even more preferably from 0 to 40 mol %, and particularly preferably from 1 to 15 mol %. When the above ratio is set to 70 mol % or less, the ratio of the constituent units represented by Formula (1) and the constituent units represented by Formula (4) can be relatively increased, and thus such a ratio tends to improve the curability of the curable composition and further increase the surface hardness and adhesion of the resulting cured product (resin layer). On the other hand, when the above ratio is set to 1 mol % or greater the gas barrier properties of the resulting cured product (resin layer) tends to be improved.

A ratio (total amount) of the constituent unit represented by Formula (1) above, the constituent unit represented by Formula (2) above, the constituent unit represented by Formula (4) above, and the constituent unit represented by Formula (5) above relative to a total amount (100 mol %) of siloxane constituent units [all siloxane constituent units; total amount of M unit, D unit, T unit, and Q unit] in the polyorganosilsesquioxane according to the present disclosure is not particularly limited, and is preferably from 60 to 100 mol %, more preferably from 70 to 100 mol %, and even more preferably from 80 to 100 mol %. When the above ratio is set to mol % or greater, the surface hardness and adhesiveness of the resulting cured product (resin layer) tend to be further improved.

A ratio of the constituent unit derived from a compound represented by Formula (a) described below and the constituent unit derived from a compound represented by Formula (b) described below relative to a total amount (100 mol %) of siloxane constituent units [all siloxane constituent units; total amount of M unit, D unit, T unit, and Q unit] in the polyorganosilsesquioxane according to the present disclosure is preferably from 60 to 100 mol %, more preferably from 70 to 100 mol %, and even more preferably from 80 to 100 mol %. The ratio of the constituent unit derived from the compound represented by Formula (a) is preferably from 55 to 100 mol %, more preferably from 65 to 100 mol %, and even more preferably from 80 to 99 mol % relative to the total amount of the siloxane constituent units. Further, the ratio of the constituent unit derived from the compound represented by Formula (b) is preferably from 0 to 70 mol %, more preferably from 0 to 60 mol %, even more preferably from 0 to 40 mol %, and particularly preferably from 1 to 15 mol %, relative to the total amount of the siloxane constituent units.

The number average molecular weight (Mn) of the polyorganosilsesquioxane according to the present disclosure, determined by gel permeation chromatography, calibrated with standard polystyrene, is not particularly limited, and for example, can be appropriately selected from a range of from 1000 to 50000. The lower limit of the number average molecular weight of the polyorganosilsesquioxane according to the present disclosure is preferably 1000, and more preferably 1100, and the upper limit is preferably 3000, more preferably 2800, and even more preferably 2600. When the number average molecular weight is set to 1000 or greater, the heat resistance, scratch resistance, and adhesiveness of the cured product (resin layer) tend to be further improved. On the other hand, when the number average molecular weight is set to 3000 or less, the compatibility with other components in the curable composition tends to be improved, and the heat resistance of the resulting cured product (resin layer) tends to be further improved.

The lower limit of the number average molecular weight of the polyorganosilsesquioxane according to another embodiment of the present disclosure is preferably 2500, more preferably 2800, and even more preferably 3000, and the upper limit is preferably 50000, more preferably 10000, and even more preferably 8000. When the number average molecular weight is set to 2500 or greater, in addition to the improvement in the heat resistance, scratch resistance, and adhesiveness of the cured product (resin layer), the surface when formed as an uncured or semi-cured resin layer tends to be tack-free, blocking resistance is improved, and winding of the resin layer onto a roll is facilitated. When the number average molecular weight is set to 50000 or less, compatibility with other components in the curable composition tends to be improved, and the heat resistance of the cured product (resin layer) tends to be further improved.

A molecular weight dispersity (Mw/Mn) of the polyorganosilsesquioxane according to the present disclosure, determined by gel permeation chromatography, calibrated with standard polystyrene, is not particularly limited, and can be appropriately selected from a range of from 1.0 to 4.0. The lower limit of the molecular weight dispersity is preferably 1.0, more preferably 1.1, and even more preferably 1.2. When the molecular weight dispersity is set to 1.1 or greater, the polyorganosilsesquioxane tends to easily become a liquid, and handleability tends to be improved. On the other hand, the upper limit of the molecular weight dispersity is preferably 4.0, more preferably 3.0, and even more preferably 2.5 (for example, preferably 3.0, more preferably 2.0, and even more preferably 1.9). When the molecular weight dispersity is set to 4.0 or less (for example, 3.0 or less), the surface hardness and adhesiveness of the cured product (resin layer) tend to increase.

Note that, the number average molecular weight and the polydispersity index of the polyorganosilsesquioxane according to the present disclosure can be measured by the following instruments under the following conditions.

Measurement instrument: "LC-20AD" (trade name, available from Shimadzu Corporation)

Column: Shodex KF-801×2, KF-802×1, and KF-803×1 (available from Showa Denko K. K.)

Measurement temperature: 40° C.

Eluent: THF, sample concentration of 0.1 to 0.2 wt. %

Flow rate: 1 mL/min

Detector: UV-VIS detector ("SPD-20A (trade name)" available from Shimadzu Corporation)

Molecular weight: calibrated with standard polystyrene

A 5% weight loss temperature ($T_{d5}$) of the polyorganosilsesquioxane according to the present disclosure in an air atmosphere is not limited, but is preferably 330° C. or higher (for example, from 330 to 450° C.), more preferably 340° C. or higher, and even more preferably 350° C. or higher. The polyorganosilsesquioxane with a 5% weight loss temperature of 330° C. or higher tends to further improve the heat resistance of the cured product (resin layer). In particular, when the polyorganosilsesquioxane according to the present disclosure has a [T3 form/T2 form] ratio of 5 or greater and 500 or less, a number average molecular weight of 1000 to 50000, and a molecular weight dispersity of 1.0 to 4.0, the 5% weight loss temperature thereof is controlled to 330° C. or higher. Here, the 5% weight loss temperature is a temperature at which the weight decreases by 5% compared to a weight prior to heating when heating is performed at a constant temperature increase rate, and is an indicator of heat resistance. The 5% weight loss temperature can be measured by thermogravimetric analysis (TGA) under conditions of a temperature increase rate of 5° C./min in an air atmosphere.

The method for producing the polyorganosilsesquioxane according to the present disclosure is not limited, and the polyorganosilsesquioxane can be produced by a known or commonly used polysiloxane production method. Examples thereof include a method of subjecting one or more types of hydrolyzable silane compounds to hydrolysis and condensation. However, as the hydrolyzable silane compound, a hydrolyzable trifunctional silane compound for forming the constituent unit represented by Formula (1) is essential.

More specifically, for example, the polyorganosilsesquioxane according to the present disclosure can be produced by a method of hydrolysis and condensation of the compound represented by Formula (a) below, which is a hydrolyzable trifunctional silane compound for forming the constituent unit represented by Formula (1), and additionally as necessary, a compound represented by Formula (b) below for forming the constituent unit represented by Formula (2), and a compound represented by Formula (c) below for forming the constituent unit represented by Formula (3).

[Chem. 15]

$$R^1Si(X^1)_3 \quad (a)$$

[Chem. 16]

$$R^2Si(X^2)_3 \quad (b)$$

[Chem. 17]

$$HSi(X^3)_3 \quad (c)$$

The compound represented by Formula (a) above is a compound that forms a constituent unit represented by Formula (1) in the polyorganosilsesquioxane according to the present disclosure. $R^1$ in Formula (a) represents a group containing a cationically polymerizable functional group, as in the case of $R^1$ in Formula (1) above. That is, $R^1$ in Formula (a) is preferably a group represented by Formula (1a) above, a group represented by Formula (1b) above, a group represented by Formula (1c) above, and a group represented by Formula (1d) above, more preferably a group represented by Formula (1a) above and a group represented by Formula (1c) above, even more preferably a group represented by Formula (1a) above, and particularly preferably a group represented by Formula (1a) above where $R^{1a}$ is an ethylene group (in particular, a 2-(3',4'-epoxycyclohexyl)ethyl group).

$X^1$ in Formula (a) above represents an alkoxy group or a halogen atom. Examples of the alkoxy group in $X^1$ include alkoxy groups having from 1 to 4 carbons, such as a methoxy group, an ethoxy group, a propoxy group, an isopropyloxy group, a butoxy group, and an isobutyloxy group. Examples of the halogen atom in $X^1$ include a fluorine atom, a chlorine atom, a bromine atom, and an iodine atom. Among these, $X^1$ is preferably an alkoxy group, more preferably a methoxy group or an ethoxy group. Note that, each of the three Vs may be the same or different.

The compound represented by Formula (b) above is a compound that forms a constituent unit represented by Formula (2) in the polyorganosilsesquioxane according to the present disclosure. $R^2$ in Formula (b) represents, as in the case of $R^2$ in Formula (2) above, a substituted or unsubstituted aryl group, a substituted or unsubstituted aralkyl group, a substituted or unsubstituted cycloalkyl group, a substituted or unsubstituted alkyl group, or a substituted or unsubstituted alkenyl group. That is, $R^2$ in Formula (b) is preferably a substituted or unsubstituted aryl group, a substituted or unsubstituted alkyl group, or a substituted or unsubstituted alkenyl group, more preferably a substituted or unsubstituted aryl group, and even more preferably a phenyl group.

$X^2$ in Formula (b) above represents an alkoxy group or a halogen atom. Specific examples of $X^2$ include those listed as examples of $X^1$. Among these, $X^2$ is preferably an alkoxy group, and more preferably a methoxy group or an ethoxy group. Note that, each of the three $X^2$s may be the same or different.

The compound represented by Formula (c) above is a compound that forms a constituent unit represented by Formula (3) in the polyorganosilsesquioxane according to the present disclosure. $X^3$ in Formula (c) above represents an alkoxy group or a halogen atom. Specific examples of $X^3$ include those listed as examples of $X^1$. Among these, $X^3$ is preferably an alkoxy group, more preferably a methoxy group or an ethoxy group. Note that, each of the three $X^3$s may be the same or different.

A hydrolyzable silane compound other than the compounds represented by Formulae (a) to (c) above may be used in combination as the hydrolyzable silane compound. Examples thereof include hydrolyzable trifunctional silane compounds other than the compounds represented by Formulae (a) to (c) above, hydrolyzable monofunctional silane compounds forming an M unit, hydrolyzable bifunctional silane compounds forming a D unit, and hydrolyzable tetrafunctional silane compounds forming a Q unit.

An amount of usage of the hydrolyzable silane compound and the composition of the hydrolyzable silane compound can be appropriately adjusted according to the desired structure of the polyorganosilsesquioxane according to the present disclosure. For example, the amount of usage of the compound represented by Formula (a) above is not particularly limited but is preferably from 55 to 100 mol %, more preferably from 65 to 100 mol %, and even more preferably from 80 to 99 mol %, relative to a total amount (100 mol %) of the hydrolyzable silane compounds used.

In addition, the amount of usage of the compound represented by Formula (b) above is not particularly limited but is preferably from 0 to 70 mol %, more preferably from 0 to 60 mol %, even more preferably from 0 to 40 mol %, and particularly preferably from 1 to 15 mol %, relative to a total amount (100 mol %) of the hydrolyzable silane compounds used.

Furthermore, the ratio (ratio of a total amount) of the compound represented by Formula (a) and the compound represented by Formula (b) relative to a total amount (100 mol %) of the hydrolyzable silane compounds used is preferably from 60 to 100 mol %, more preferably from 70 to 100 mol %, and even more preferably from to 100 mol %.

In addition, in a case where two or more types of the hydrolyzable silane compounds are used in combination, the hydrolysis and condensation reaction of these hydrolyzable silane compounds can be performed simultaneously or sequentially. The order of the reactions when performed sequentially is not particularly limited.

The hydrolysis and the condensation reaction of the hydrolyzable silane compound may be performed in one step or may be performed in two or more steps. For example, to efficiently produce the polyorganosilsesquioxane according to the present disclosure with the above-described [T3 form/T2 form] ratio of less than 20 and/or a number average molecular weight of less than 2500 (which may be hereinafter referred to as a "low molecular weight polyorganosilsesquioxane"), the hydrolysis and condensation reaction are preferably performed in one step.

To efficiently produce the polyorganosilsesquioxane according to the present disclosure with the above-described [T3 form/T2 form] ratio of 20 or greater and/or a number average molecular weight of 2500 or greater (which may be hereinafter referred to as a "high molecular weight polyorganosilsesquioxane"), the hydrolysis and condensation reaction are preferably performed in two or more steps (preferably two steps), that is, the hydrolysis and condensation reaction are preferably performed one or more times using the low molecular weight polyorganosilsesquioxane as a raw material.

An aspect, in which a low molecular weight polyorganosilsesquioxane is obtained by carrying out the hydrolysis and condensation reaction of the hydrolyzable silane compound in one step, and then the low molecular weight polyorganosilsesquioxane is further subjected to the hydrolysis and condensation reaction to form a high molecular weight polyorganosilsesquioxane, is described below, but the method for producing the polyorganosilsesquioxane according to the present disclosure is not limited thereto.

When the hydrolysis and condensation reaction are performed in two steps, preferably, in the hydrolysis and condensation reaction of the first step, a polyorganosilsesquioxane having a [T3 form/T2 form] ratio of 5 or greater and less than 20, and a number average molecular weight of 1000 or greater and less than 2500 is formed, and in the hydrolysis and condensation reaction of the second step, the low molecular weight polyorganosilsesquioxane is further subjected to hydrolysis and condensation reaction, thereby obtaining a high molecular weight polyorganosilsesquioxane having a [T3 form/T2 form] ratio of 20 to 500 and a number average molecular weight of 2500 to 50000.

The hydrolysis and condensation reaction of the first step can be performed in the presence or absence of a solvent. Among these, the hydrolysis and condensation reaction are preferably performed in the presence of a solvent. Examples of the solvent include aromatic hydrocarbons, such as benzene, toluene, xylene, and ethylbenzene; ethers, such as diethyl ether, dimethoxyethane, tetrahydrofuran, and dioxane; ketones, such as acetone, methyl ethyl ketone, and methyl isobutyl ketone; esters, such as methyl acetate, ethyl acetate, isopropyl acetate, and butyl acetate; amides, such as N,N-dimethylformamide and N,N-dimethylacetamide; nitriles, such as acetonitrile, propionitrile, and benzonitrile; and alcohols, such as methanol, ethanol, isopropyl alcohol, and butanol. Among these, the solvent is preferably a ketone or an ether. In addition, one type of the solvent can be used alone, or two or more types thereof can be used in combination.

The amount of the solvent usage in the hydrolysis and condensation reaction of the first step is not particularly limited and can be appropriately adjusted in a range of from 0 to 2000 parts by weight relative to 100 parts by weight of a total amount of the hydrolyzable silane compound, according to a desired reaction time or the like.

The hydrolysis and condensation reaction of the first step are preferably carried out in the presence of a catalyst and water. The catalyst may be an acid catalyst or an alkali catalyst, but an alkali catalyst is preferably used to prevent degradation of the cationically polymerizable functional group, such as an epoxy group. Examples of the acid catalyst include mineral acids, such as hydrochloric acid, sulfuric acid, nitric acid, phosphoric acid, and boric acid; phosphate esters; carboxylic acids, such as acetic acid, formic acid, and trifluoroacetic acid; sulfonic acids, such as methanesulfonic acid, trifluoromethanesulfonic acid, and p-toluenesulfonic acid; solid acids, such as activated clay; and Lewis acids, such as iron chloride. Examples of the alkali catalyst include alkali metal hydroxides, such as lithium hydroxide, sodium hydroxide, potassium hydroxide, and cesium hydroxide; alkaline earth metal hydroxides, such as magnesium hydroxide, calcium hydroxide, and barium hydroxide; alkali metal carbonates, such as lithium carbonate, sodium carbonate, potassium carbonate, and cesium carbonate; alkaline earth metal carbonates, such as magnesium carbonate; alkali metal hydrogencarbonates, such as lithium hydrogencarbonate, sodium hydrogencarbonate, sodium hydrogencarbonate, potassium hydrogencarbonate, and cesium hydrogencarbonate; alkali metal organic acid salts (for example, acetates), such as lithium acetate, sodium acetate, potassium acetate, and cesium acetate; alkaline earth metal organic acid salts (for example, acetates), such as magnesium acetate; alkali metal alkoxides, such as lithium methoxide, sodium methoxide, sodium ethoxide, sodium isopropoxide, potassium ethoxide, and potassium t-butoxide; alkali metal phenoxides, such as sodium phenoxide; amines (tertiary amines), such as triethylamine, N-methylpiperidine, 1,8-diazabicyclo[5.4.0]undec-7-ene, and 1,5-diazabicyclo[4.3.0]non-5-ene; and nitrogen-containing heterocyclic aromatic compounds, such as pyridine, 2,2'-bipyridyl, and 1,10-phenanthroline. Here, one type of the catalyst can be used alone, or two or more types thereof can be used in combination. In addition, the catalyst can be used in a state of being dissolved or dispersed in water, a solvent, or the like.

The amount of the catalyst usage in the hydrolysis and condensation reaction of the first step is not particularly limited and can be appropriately adjusted in a range of from 0.002 to 0.200 mol relative to a total amount of 1 mol of the hydrolyzable silane compounds.

The amount of water usage during the hydrolysis and condensation reaction of the first step is not particularly limited and can be appropriately adjusted in a range of from 0.5 to 20 mol relative to a total amount of 1 mol of the hydrolyzable silane compounds.

The method for adding water in the hydrolysis and condensation reaction of the first step is not particularly limited, and the total amount (total amount of usage) of water to be used may be added all at once or may be added sequentially. When the water is added sequentially, it may be added continuously or intermittently.

As the reaction conditions for the hydrolysis and condensation reaction of the first step, it is particularly important to select reaction conditions that allow the above [T3 form/T2 form] ratio in the low molecular weight polyorganosilsesquioxane to be or greater and less than 20. The reaction temperature of the hydrolysis and condensation reaction of the first step is not particularly limited but is preferably from to 100° C. and more preferably from 45 to 80° C. Controlling the reaction temperature to the above range tends to facilitate a more efficient control of the above [T3 form/T2 form] ratio to 5 or more and less than 20. In addition, the reaction time of the hydrolysis and condensation reaction of the first step is not particularly limited, but is preferably from 0.1 to 10 hours and more preferably from 1.5 to 8 hours. Furthermore, the hydrolysis and condensation reaction of the first step can be performed under normal pressure, or can be performed under increased pressure or reduced pressure. Here, the atmosphere when performing the hydrolysis and condensation reaction of the first step is not particularly limited, and for example, the reaction may be performed in any of an inert gas atmosphere, such as a nitrogen atmosphere or an argon atmosphere, or in the presence of oxygen, such as in the air. However, the hydrolysis and condensation reaction is preferably performed in an inert gas atmosphere.

The low molecular weight polyorganosilsesquioxane can be obtained by the hydrolysis and condensation reaction of the first step. After completion of the hydrolysis and condensation reaction of the first step, the catalyst is preferably neutralized to prevent degradation of the cationically polymerizable functional group, such as ring-opening of the epoxy group. Also, the low molecular weight polyorganosilsesquioxane may be separated and purified through, for example, a separation means such as rinsing with water, acid washing, alkali washing, filtration, concentration, distillation, extraction, crystallization, recrystallization, or column chromatography, or a separation means of a combination thereof.

The low molecular weight polyorganosilsesquioxane, formed in the hydrolysis and condensation reaction of the first step, is subjected to the hydrolysis and condensation reaction of the second step, whereby the high molecular weight polyorganosilsesquioxane can be produced.

The hydrolysis and condensation reaction of the second step can be performed in the presence or absence of a solvent. When the hydrolysis and condensation reaction of the second step is performed in the presence of a solvent, a solvent given as an example with regard to the hydrolysis and condensation reaction of the first step can be used. As the solvent of the hydrolysis and condensation reaction of the second step, the low molecular weight polyorganosilsesquioxane containing the reaction solvent and extraction solvent of the hydrolysis and condensation reaction of the first step may be used as is or may be partially distilled away and used. In addition, one type of the solvent can be used alone, or two or more types thereof can be used in combination.

In a case where the solvent is used in the hydrolysis and condensation reaction of the second step, the amount of usage thereof is not particularly limited, and may be appropriately adjusted to a range of from 0 to 2000 parts by weight relative to 100 parts by weight of the low molecular weight polyorganosilsesquioxane, according to a desired reaction time or the like.

The hydrolysis and condensation reaction of the second step is preferably carried out in the presence of a catalyst and water. The catalyst for the hydrolysis and condensation reaction of the first step can be used as the catalyst above. To suppress degradation of cationically polymerizable functional groups such as an epoxy group, the catalyst is preferably an alkali catalyst, more preferably an alkali metal hydroxide such as sodium hydroxide, potassium hydroxide, or cesium hydroxide, or a carbonate of an alkali metal such as lithium carbonate, sodium carbonate, potassium carbonate, or cesium carbonate. Here, one type of the catalyst can be used alone, or two or more types thereof can be used in combination. In addition, the catalyst can be used in a state of being dissolved or dispersed in water, a solvent, or the like.

The amount of usage of the catalyst in the hydrolysis and condensation reaction of the second step is not particularly limited, and may be appropriately adjusted to a range of preferably from 0.01 to 10000 ppm, and more preferably from 0.1 to 1000 ppm, relative to the amount of the low molecular weight polyorganosilsesquioxane (1000000 ppm).

The amount of water usage in the hydrolysis and condensation reaction of the second step is not particularly limited, and may be appropriately adjusted to a range of preferably from 10 to 100000 ppm, and more preferably from 100 to 20000 ppm, relative to the amount of the low molecular weight polyorganosilsesquioxane (1000000 ppm). When the amount of water usage is greater than 100000 ppm, the [T3 form/T2 form] ratio and the number average molecular weight of the high molecular weight polyorganosilsesquioxane may not be easily controlled to the predetermined ranges.

The method for adding the water in the hydrolysis and condensation reaction of the second step is not particularly limited, and the total amount of the water to be used (total amount of usage) may be added all at once or may be added sequentially. When the water is added sequentially, it may be added continuously or intermittently.

As the reaction conditions for the hydrolysis and condensation reaction of the second step, it is particularly important to select reaction conditions that allow the above [T3 form/T2 form] ratio in the high molecular weight polyorganosilsesquioxane to be from 20 to 500, and the number average molecular weight to be from 2500 to 50000. The reaction temperature of the hydrolysis and condensation reaction of the second step may vary depending on the catalyst that is used, and is not particularly limited, but is preferably from 5 to 200° C., and more preferably from 30 to 100° C. When the reaction temperature is controlled to the above range, the [T3 form/T2 form] ratio and the number average molecular weight tend to be more efficiently controlled to the desired ranges. In addition, the reaction time of the hydrolysis and condensation reaction of the second step is not particularly limited, but is preferably from 0.5 to 1000 hours, and more preferably from 1 to 500 hours.

Additionally, sampling may be performed at an appropriate time while the hydrolysis and condensation reaction are carried out within the reaction temperature range described above, and the reaction is carried out while the [T3 form/T2 form] ratio and the number average molecular weight are monitored, whereby the high molecular weight polyorganosilsesquioxane having the desired [T3 form/T2 form] ratio and number average molecular weight can be formed.

Furthermore, the hydrolysis and condensation reaction of the second step can be performed under normal pressure, or can be performed under increased pressure or reduced pressure. Here, the atmosphere when performing the hydrolysis and condensation reaction of the second step is not particularly limited, and for example, the reaction may be performed in any of an inert gas atmosphere, such as a nitrogen atmosphere or an argon atmosphere, or in the presence of oxygen, such as in the air. However, the hydrolysis and condensation reaction is preferably performed in an inert gas atmosphere.

The high molecular weight polyorganosilsesquioxane can be obtained by the hydrolysis and condensation reaction of the second step. After completion of the hydrolysis and condensation reaction of the second step, the catalyst is preferably neutralized to prevent degradation of the cationically polymerizable functional group, such as ring-opening of the epoxy group. The high molecular weight polyorganosilsesquioxane may be separated and purified through, for example, a separation means such as water washing, acid washing, alkali washing, filtration, concentration, distillation, extraction, crystallization, recrystallization, or column chromatography, or a separation means of a combination thereof.

The use of the curable composition containing the polyorganosilsesquioxane according to the present disclosure as an essential component enables formation of a cured product having a high level of surface hardness and excellent bending resistance, resulting in the formation of a resin layer satisfying Conditions 1 to 5 described above.

Note that in the curable composition according to the present disclosure, one type of the polyorganosilsesquioxane according to the present disclosure can be used alone, or two or more types thereof can be used in combination.

A content (blended amount) of the polyorganosilsesquioxane according to the present disclosure in the curable composition of the present disclosure relative to a total amount (100 wt. %) of the curable composition excluding solvent is not particularly limited, and is preferably 50 wt. % or greater and less than 100 wt. %, more preferably from 60 to 99 wt. %, and even more preferably from 70 to 95 wt. %. When the content of the polyorganosilsesquioxane according to the present disclosure is set to 50 wt. % or greater, the surface hardness and adhesiveness of the cured product (resin layer) tend to be further improved. Further, the content of the polyorganosilsesquioxane according to the present disclosure is set to less than 100 wt. % (e.g., 95 wt. % or less), and the curable composition is allowed to contain a curing catalyst, a compound having one or more thermally polymerizable functional groups and one or more photopolymerizable functional groups in a molecule as described below (or a compound having one or more cationically polymerizable groups and one or more radically polymerizable groups in the molecule), an epoxy compound, a fluorine-containing photopolymerizable resin (or a fluorine-containing radically polymerizable compound), and an aliphatic compound having two or more thermally polymerizable functional groups in a molecule (or an aliphatic compound having two or more cationically polymerizable groups in a molecule), which tends to produce effects of more efficiently advancing the curing reaction of the curable composition, improving the surface hardness, bendability, and bending resistance, and preventing deterioration of the antifouling performance.

A ratio of the polyorganosilsesquioxane according to the present disclosure relative to a total amount (100 wt. %) of a cationically curable compound contained in the curable composition of the present disclosure is not particularly limited, but is preferably from 60 to 99 wt. %, more preferably from 65 to 98 wt. %, and even more preferably from 70 to 95 wt. %. When the content of the polyorganosilsesquioxane according to the present disclosure is set to 60 wt. % or greater, the surface hardness and adhesiveness of the cured product (resin layer) tend to be further improved. In addition, the content of the polyorganosilsesquioxane according to the present disclosure is set to 99 wt. % or less, and the curable composition is allowed to contain a compound having one or more thermally polymerizable functional groups and one or more photopolymerizable functional groups in a molecule as described below (or a compound having one or more cationically polymerizable groups and one or more radically polymerizable groups in the molecule), an epoxy compound, an aliphatic compound having two or more thermally polymerizable functional groups in a molecule (or an aliphatic compound having two or more cationically polymerizable groups in a molecule), or the like is used in combination, which tends to produce effects of improving the surface hardness, bendability, and bending resistance, and preventing deterioration of the antifouling performance.

Compound A

A compound A is a compound having one or more thermally polymerizable functional groups and one or more photopolymerizable functional groups in a molecule.

The curable composition according to the present disclosure preferably includes a compound (hereinafter, also referred to as "compound A") having one or more thermally polymerizable functional groups and one or more photopolymerizable functional groups in a molecule. When the curable composition according to the present disclosure includes the compound A along with the polyorganosilsesquioxane according to the present disclosure, the crosslinking density when the curable composition is formed into a cured product can be effectively increased, and a high level of surface hardness and excellent bendability and bending resistance are more easily imparted to the cured product (resin layer). Further, deterioration of the antifouling performance is prevented.

The "thermally polymerizable functional group" is not particularly limited as long as it is a functional group that imparts polymerizability through heat to the compound A. Examples thereof include a hydroxyl group, an epoxy group, an oxetanyl group, and a vinyl ether group. From the perspective of suppressing deterioration in surface hardness, bendability, bending resistance, and antifouling performance of the resin layer according to the present disclosure, a hydroxyl group and an epoxy group are preferred. Note that when the compound A has two or more thermally-polymerizable functional groups, these thermally-polymerizable functional groups may each be the same or different.

The "photopolymerizable functional group" of the compound A is not particularly limited as long as it is a functional group that imparts polymerizability through light (for example, ultraviolet light) to the compound A, and examples thereof include a (meth)acryloyl group and a vinyl group. However, from the perspectives of surface hardness and bending resistance of the resin layer according to the present disclosure, a (meth)acryloyl group is preferred. Note that when the compound A has two or more radically photopolymerizable functional groups photopolymerizable functional groups, these photopolymerizable functional groups may each be the same or different.

The number of the thermally polymerizable functional groups per molecule of the compound A is not particularly limited, but for example, is preferably from 1 to 5, more preferably from 1 to 3, and even more preferably 1 or 2. In addition, the number of the photopolymerizable functional groups per molecule of the compound A is not particularly limited, but for example, is preferably from 1 to 5, more preferably from 1 to 3, and even more preferably 1 or 2.

A functional group equivalent weight of the thermally polymerizable functional group of the compound A is not particularly limited, and is, for example, from 50 to 500. The lower limit of the functional group equivalent weight is preferably 80. The upper limit of the functional group equivalent weight is preferably 480, more preferably 450, even more preferably 300, particularly preferably 250, most preferably 200, and especially preferably 150. When the functional group equivalent weight is less than 50, the bending resistance of the cured product (resin layer) may be insufficient. On the other hand, when the functional group equivalent weight is greater than 500, the surface hardness of the cured product (resin layer) may be decreased. Note that the functional group equivalent of the thermally-polymerizable functional group of the compound A can be calculated from the following equation:

[Functional group equivalent weight of the thermally polymerizable functional group]=[molecular weight of compound $A$]/[number of thermally polymerizable functional groups contained in compound $A$]

A functional group equivalent weight of the photopolymerizable functional group of the compound A is not particularly limited, and is, for example, from 50 to 500. The lower limit of the functional group equivalent weight is preferably 80. The upper limit of the functional group equivalent weight is preferably 480, more preferably 450, even more preferably 300, particularly preferably 250, most preferably 200, and especially preferably 150. When the functional group equivalent weight is less than 50, the bending resistance of the cured product (resin layer) may be insufficient. On the other hand, when the functional group equivalent weight is greater than 500, the surface hardness of the cured product (resin layer) may be decreased. Note that the functional group equivalent of the photopolymerizable functional group of compound A can be calculated from the following equation:

[Functional group equivalent weight of photopolymerizable functional group]=[molecular weight of compound *A*]/[number of photopolymerizable functional groups contained in compound *A*]

The thermally polymerizable functional group and the photopolymerizable functional group of the compound A may be a cationically polymerizable group and a radically polymerizable group, respectively. That is, the compound A may be a compound having one or more cationically polymerizable groups and one or more radically polymerizable groups in the molecule.

The curable composition according to the present disclosure preferably contains, as a curable compound, the compound A and a fluorine-containing polymerizable compound described below along with the polyorganosilsesquioxane according to the present disclosure. When the curable composition according to the present disclosure contains a fluorine-containing radically polymerizable compound described below along with the compound A, the fluorine-containing radically polymerizable compound is bonded to the polyorganosilsesquioxane according to the present disclosure via the compound A, thereby preventing deterioration of the antifouling performance of the cured product (resin layer).

The "cationically polymerizable group" is not particularly limited, and examples thereof include a hydroxyl group, an epoxy group, an oxetanyl group, and a vinyl ether group. From the perspective of suppressing deterioration in surface hardness, bendability, bending resistance, and antifouling performance of the resin layer according to the present disclosure, a hydroxyl group and an epoxy group are preferred. Note that when the compound A has two or more cationically polymerizable groups, these cationically polymerizable groups may each be the same or different.

The "radically polymerizable group" is not particularly limited, and examples thereof include a (meth)acryloyl group and a vinyl group. However, from the perspectives of surface hardness and bending resistance of the resin layer according to the present disclosure, a (meth)acryloyl group is preferred. Note that when the compound A has two or more radically polymerizable groups, these radically polymerizable groups may each be the same or different.

The number of the cationically polymerizable group per molecule of the compound A is not particularly limited, but for example, is preferably from 1 to 5, more preferably from 1 to 3, and even more preferably 1 or 2. In addition, the number of the radically polymerizable groups per molecule of the compound A is not particularly limited, but for example, is preferably from 1 to 5, more preferably from 1 to 3, and even more preferably 1 or 2.

The functional group equivalent weight of the cationically polymerizable group of the compound A is preferably from 50 to 500, more preferably from 80 to 400, even more preferably from 80 to 300, particularly preferably from 90 to 250, most preferably from 90 to 200, and especially preferably from 90 to 150. When the functional group equivalent weight is less than 50, the bending resistance of the cured product (resin layer) may be insufficient. On the other hand, when the functional group equivalent weight is greater than 500, the surface hardness of the cured product (resin layer) may be decreased. Note that the functional group equivalent weight of the cationically polymerizable group of the compound A can be calculated from the following equation:

[Functional group equivalent weight of cationically polymerizable group]=[molecular weight of compound *A*]/[number of cationically polymerizable groups contained in compound *A*]

The functional group equivalent weight of the radically polymerizable group of the compound A is preferably from 50 to 500, more preferably from 80 to 400, even more preferably from 80 to 300, particularly preferably from 90 to 250, most preferably from 90 to 200, and especially preferably from 90 to 150. When the functional group equivalent weight is less than 50, the bending resistance of the cured product (resin layer) may be insufficient. On the other hand, when the functional group equivalent weight is greater than 500, the surface hardness of the cured product (resin layer) may be decreased. Note that the functional group equivalent of the photopolymerizable functional group of compound A can be calculated from the following equation:

[Functional group equivalent weight of radically polymerizable group]=[molecular weight of compound *A*]/[number of radically polymerizable groups contained in compound *A*]

Specific examples of the compound A include compounds having an epoxy group and/or a hydroxyl group and a (meth)acryloyl group per molecule, such as 3,4-epoxycyclohexylmethyl (meth)acrylate, glycidyl (meth)acrylate, tripropylene glycol diglycidyl ether di(meth)acrylate (a compound obtained by reacting (meth)acrylic acid with both epoxy groups of tripropylene glycol diglycidyl ether), tripropylene glycol diglycidyl ether half (meth)acrylate (a compound obtained by reacting (meth)acrylic acid with one epoxy group of tripropylene glycol diglycidyl ether), bisphenol A epoxy (meth)acrylate (a compound obtained by reacting (meth)acrylic acid with both epoxy groups of bisphenol A diglycidyl ether), bisphenol A epoxy half (meth) acrylate (a compound obtained by reacting (meth)acrylic acid or a derivative thereof with one epoxy group of bisphenol A diglycidyl ether), bisphenol F epoxy di(meth) acrylate, bisphenol F epoxy half (meth)acrylate, bisphenol S epoxy di(meth)acrylate, bisphenol S epoxy half (meth)acrylate; compounds having an oxetanyl group and a (meth) acryloyl group per molecule, such as 3-oxetanyl methyl (meth)acrylate, 3-methyl-3-oxetanyl methyl(meth)acrylate, 3-ethyl-3-oxetanyl methyl (meth)acrylate, 3-butyl-3-oxetanyl methyl (meth)acrylate, 3-hexyl-3-oxetanyl methyl (meth)acrylate; and compounds having a vinyl ether group and a (meth)acryloyl group per molecule, such as 2-vinyloxy ethyl (meth)acrylate, 3-vinyloxy propyl (meth)acrylate, 1-methyl-vinyloxy ethyl (meth)acrylate, 2-vinyloxy propyl (meth)acrylate, 4-vinyloxy butyl (meth)acrylate, 1-methyl-3-vinyloxy propyl (meth)acrylate, 1-vinyloxy methylpropyl (meth)acrylate, 2-methyl-3-vinyloxy propyl (meth)acrylate, 1,1-dimethyl-2-vinyloxy ethyl (meth)acrylate, 3-vinyloxy butyl (meth)acrylate, 1-methyl-2-vinyloxy propyl (meth) acrylate, 2-vinyloxy butyl (meth)acrylate, 4-vinyloxy cyclohexyl (meth)acrylate, 6-vinyloxy hexyl (meth)acrylate, 4-vinyloxy methylcyclohexyl methyl (meth)acrylate, 3-vinyloxy methylcyclohexyl methyl (meth)acrylate, 2-vinyloxy cyclohexyl methyl (meth)acrylate, p-vinyloxy methylphenyl methyl (meth)acrylate, m-vinyloxy methylphenyl methyl (meth)acrylate, o-vinyloxy methylphenyl methyl (meth) acrylate, 2-(vinyloxyethoxy)ethyl (meth)acrylate, 2-(vinyloxyisopropoxy)ethyl (meth)acrylate, 2-(vinyloxyethoxy) propyl (meth)acrylate, 2-(vinyloxyethoxy)isopropyl (meth)

acrylate, 2-(vinyloxyisopropoxy)propyl (meth)acrylate, 2-(vinyloxyisopropoxy)isopropyl (meth)acrylate, 2-(vinyloxyethoxyethoxy)ethyl (meth)acrylate, 2-(vinyloxyethoxyisopropoxy)ethyl (meth)acrylate, 2-(vinyloxyisopropoxyethoxy)ethyl (meth)acrylate, 2-(vinyloxyisopropoxyisopropoxy)ethyl (meth)acrylate, 2-(vinyloxyethoxyethoxy)propyl (meth)acrylate, 2-(vinyloxyethoxyisopropoxy)propyl (meth)acrylate, 2-(vinyloxyisopropoxyethoxy)propyl (meth)acrylate, 2-(vinyloxyisopropoxyisopropoxy)propyl (meth)acrylate, 2-(vinyloxyethoxyethoxy)isopropyl (meth)acrylate, 2-(vinyloxyethoxyisopropoxy)isopropyl (meth)acrylate, 2-(vinyloxyisopropoxyethoxy)isopropyl (meth)acrylate, 2-(vinyloxyisopropoxyisopropoxy)isopropyl (meth)acrylate, 2-(vinyloxyethoxyethoxyethoxy)ethyl (meth)acrylate, 2-(vinyloxyethoxyethoxyethoxyethoxy)ethyl (meth)acrylate, 2-(isopropenoxyethoxy)ethyl (meth)acrylate, 2-(isopropenoxyethoxyethoxy)ethyl (meth)acrylate, 2-(isopropenoxyethoxyethoxyethoxy)ethyl (meth)acrylate, 2-(isopropenoxyethoxyethoxyethoxyethoxy)ethyl (meth)acrylate, polyethylene glycol monovinyl ether (meth)acrylate, and polypropylene glycol monovinyl ether (meth)acrylate.

From the perspectives of the bending resistance and surface hardness of the cured product (resin layer), the compound A is preferably a compound having, per molecule, an epoxy group and/or hydroxyl group and a (meth) acryloyl group. Specifically, 3,4-epoxycyclohexylmethyl (meth)acrylate, glycidyl (meth)acrylate, tripropylene glycol diglycidyl ether half (meth)acrylate, bisphenol A epoxy half (meth)acrylate, bisphenol F epoxy half (meth)acrylate, and bisphenol S epoxy half (meth)acrylate are preferred.

In the curable composition according to the present disclosure, one type of the compound A can be used alone, or two or more types thereof can be used in combination. The compound A can be produced by a known method, and is obtained, for example, by a method of reacting some of the thermally-polymerizable functional groups of a compound having two or more thermally-polymerizable functional groups (for example, epoxy groups or hydroxyl groups) per molecule with a carboxylic acid (for example, acrylic acid or methacrylic acid) having a photopolymerizable functional group, or with a derivative thereof. Furthermore, commercially available products such as products of the trade names "Light Ester G", "Epoxy Ester 200PA", and "Epoxy Ester 200PA-E5" (the above are available from Kyoeisha Chemical Co., Ltd.), and product of the trade name "NK OLIGO EA1010N" (available from Shin-Nakamura Chemical Co., Ltd.) may also be used as the compound A.

A content (blended amount) of the compound A in the curable composition according to the present disclosure is not particularly limited, and the solid content thereof is preferably from 1 to 100 parts by weight, more preferably from 1.5 to 75 parts by weight, even more preferably from 2 to 50 parts by weight, particularly preferably from 2 to 20 parts by weight, most preferably from 2 to 15 parts by weight, and especially preferably from 2 to 10 parts by weight, relative to 100 parts by weight of the polyorganosilsesquioxane according to the present disclosure. When the content of the compound A is set to not less than 1 part by weight, the bendability and bending resistance of the cured product (resin layer) tend to be improved, and the antifouling performance tends to be hardly deteriorated. On the other hand, when the content of the compound A is set to not less than 100 parts by weight, the surface hardness of the cured product (resin layer) tends to be maintained.

Compound B

A compound B is, for example, an aliphatic compound having two or more thermally polymerizable functional groups in the molecule. When a compound having one or more thermally polymerizable functional groups and one or more photopolymerizable functional groups in the molecule is used as the compound A, an aliphatic compound having two or more thermally polymerizable functional groups in the molecule is used as the compound B.

The curable composition according to the present disclosure preferably contains, as the curable compound, an aliphatic compound having two or more thermally polymerizable functional groups in the molecule. When the curable composition according to the present disclosure includes the compound B along with the polyorganosilsesquioxane according to the present disclosure, the compound A, and the fluorine-containing photopolymerizable resin, the crosslinking density when the curable composition is formed into a cured product can be effectively increased, and a high level of surface hardness and excellent bendability and bending resistance are more easily imparted to the cured product (resin layer). Further, deterioration of the antifouling performance is prevented. In particular, this effect is made more significant by blending the compound B along with the compound A and the fluorine-containing photopolymerizable resin in the curable composition according to the present disclosure.

The "thermally polymerizable functional group" is not particularly limited as long as it is a functional group that imparts polymerizability through heat to the compound B. Examples thereof include an epoxy group, an oxetanyl group, and a vinyl ether group. From the perspective of suppressing deterioration in surface hardness, bendability, bending resistance, and antifouling performance of the resin layer according to the present disclosure, an epoxy group is preferred, and a glycidyl group is more preferred in terms of reactivity. Note that when the compound B has two or more thermally polymerizable functional groups, these thermally polymerizable functional groups may each be the same or different.

The number of thermally polymerizable functional groups per molecule of the compound B is not particularly limited as long as it is 2 or greater, but for example, is preferably from 2 to 5, more preferably from 2 to 3, and even more preferably 2.

The functional group equivalent weight of the thermally polymerizable functional group of the compound B is not particularly limited, but is preferably from 50 to 500, more preferably from 80 to 480, even more preferably from 120 to 450, particularly preferably from 120 to 300, most preferably from 120 to 250, and especially preferably from 120 to 200. When the functional group equivalent weight is less than 50, the bendability and bending resistance of the cured product (resin layer) may be insufficient. On the other hand, when the functional group equivalent weight is greater than 500, the surface hardness of the cured product (resin layer) may be decreased. Note that the functional group equivalent weight of the thermally polymerizable functional group of the compound B can be calculated from the following equation:

[Functional group equivalent weight of the thermally polymerizable functional group]=[molecular weight of compound *B*]/[number of thermally polymerizable functional groups contained in compound *B*]

The compound B is a compound in which a portion excluding the thermally polymerizable functional group is an aliphatic hydrocarbon backbone, and have no cyclic structure. Examples of the compound B include glycidyl ethers of dihydric or higher alcohol having no cyclic structure; and glycidyl esters of divalent or higher carboxylic acid having no cyclic structure.

The thermally polymerizable functional group of the compound B may be a cationically polymerizable group. That is, the compound B may be an aliphatic compound having two or more cationically polymerizable groups in the molecule. When a compound having one or more cationically polymerizable groups and one or more radically polymerizable groups in the molecule is used as the compound A, an aliphatic compound having two or more cationically polymerizable groups per molecule is used as the compound B.

When the curable composition according to the present disclosure includes the aliphatic compound having two or more cationically polymerizable groups in the molecule along with the polyorganosilsesquioxane according to the present disclosure, the crosslinking density when the curable composition is formed into a cured product can be effectively increased, and a high level of surface hardness and excellent bendability and bending resistance are more easily imparted to the cured product (resin layer).

The "cationically polymerizable group" is not particularly limited, and examples thereof include an epoxy group, an oxetanyl group, and a vinyl ether group. From the perspective of suppressing deterioration in surface hardness, bendability, bending resistance, and antifouling performance of the resin layer according to the present disclosure, an epoxy group is preferred, and a glycidyl group is more preferred in terms of reactivity. Note that when the compound B has two or more cationically polymerizable groups, these cationically polymerizable groups may each be the same or different.

The number of the cationically polymerizable groups per molecule of the compound B is not particularly limited as long as it is 2 or greater, but for example, is preferably from 2 to 5, more preferably from 2 to 3, and even more preferably 2.

The functional group equivalent weight of the cationically polymerizable group of the compound B is not particularly limited, but is preferably from 50 to 500, more preferably from 80 to 480, even more preferably from 120 to 450, particularly preferably from 120 to 300, most preferably from 120 to 250, and especially preferably from 120 to 200. When the functional group equivalent weight is less than 50, the bendability and bending resistance of the cured product (resin layer) may be insufficient. On the other hand, when the functional group equivalent weight is greater than 500, the surface hardness of the cured product (resin layer) may be decreased. Note that the functional group equivalent weight of the cationically polymerizable group of the compound B can be calculated from the following equation:

[Functional group equivalent weight of cationically polymerizable group]=[molecular weight of compound *B*]/[number of cationically polymerizable groups contained in compound *B*]

The compound B is, for example, a compound in which the cationically polymerizable group is bonded to an aliphatic hydrocarbon backbone. Examples of the compound B include glycidyl ethers of dihydric or higher aliphatic alcohol; and glycidyl esters of divalent or higher aliphatic carboxylic acid.

Examples of the dihydric or higher alcohol having no cyclic structure (or dihydric or higher aliphatic alcohol) include dihydric alcohols, such as ethylene glycol, 1,2-propanediol, 1,3-propanediol, 1,4-butanediol, neopentyl glycol, 1,6-hexanediol, diethylene glycol, triethylene glycol, tetraethylene glycol, dipropylene glycol, polyethylene glycol, and polypropylene glycol; and trihydric or higher polyhydric alcohols, such as glycerin, diglycerin, erythritol, trimethylolethane, trimethylolpropane, pentaerythritol, dipentaerythritol, and sorbitol. In addition, the dihydric or higher alcohol having no cyclic structure (or dihydric or higher aliphatic alcohol) may be a polyether polyol, a polyester polyol, a polycarbonate polyol, a polyolefin polyol, or the like.

Examples of the divalent or higher carboxylic acid having no cyclic structure (or divalent or higher aliphatic carboxylic acid) include adipic acid, sebacic acid, maleic acid, and itaconic acid.

As the compound B, a compound having thermally polymerizable functional groups (or cationically polymerizable groups) at both ends of an aliphatic hydrocarbon backbone is preferred, and a diglycidyl ether of dihydric alcohol (or dihydric aliphatic alcohol) having no cyclic structure is particularly preferred.

The compound B is a compound represented by Formula (B) below:

[Chem. 18]

$$E^1\text{-O-M-O-}E^2 \quad (B)$$

In Formula (B) above, M represents a linear or branched alkylene group having from 2 to 10 carbons. Examples of the linear or branched alkylene group having from 2 to 10 carbons include linear or branched alkylene groups having from 2 to 10 carbons, such as an ethylene group, a propylene group, a trimethylene group, a tetramethylene group, a pentamethylene group, a hexamethylene group, and a decamethylene group. Among them, M is preferably a linear or branched alkylene group having from 3 to 8 carbons, more preferably a linear alkylene group having from 5 to 7 carbons, and even more preferably a linear alkylene group having 6 carbons (hexamethylene group), from the perspectives of improving the surface hardness, bendability, and bending resistance of the cured product (resin layer), and preventing deterioration of the antifouling performance. In a case where the number of carbons in the alkylene group is greater than the above range, the bendability is improved, but the surface hardness tends to be decreased. On the other hand, in a case where the number of carbons of the alkylene group is less than the above range, the surface hardness is improved, but the bendability tends to be decreased.

In Formula (B) above, $E^1$ and $E^2$ are each the same or different, each represent a thermally polymerizable functional group (or a cationically polymerizable group), and are preferably a group represented by Formula (E) below, from the perspectives of improving the reactivity, the surface hardness, bendability, and bending resistance of the cured product (resin layer) and preventing deterioration of the antifouling performance.

[Chem. 19]

(E)

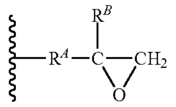

In Formula (E), $R^A$ represents a linear or branched alkylene group having from 1 to 6 carbons. Examples of the linear or branched alkylene group having from 1 to 6 carbons include a methylene group, a methyl methylene group, a dimethyl methylene group, an ethylene group, a propylene group, a trimethylene group, a tetramethylene group, a pentamethylene group, a hexamethylene group, and a decamethylene group. Among them, $R^A$ is preferably a linear alkylene group having from 1 to 4 carbons, more preferably a methylene group or an ethylene group, and even more preferably a methylene group, from the perspectives of improving the reactivity and surface hardness, bendability, and bending resistance of the cured product (resin layer), and preventing deterioration of the antifouling performance. $R^B$ is a hydrogen atom or a linear or branched alkyl group having from 1 to 6 carbons, preferably a hydrogen atom or a methyl group, and more preferably a hydrogen atom.

Specific examples of the compound B include alkylene glycol diglycidyl ethers (alkanediol diglycidyl ethers) such as ethylene glycol diglycidyl ether, propylene glycol diglycidyl ether, 1,3-propanediol diglycidyl ether, 2-methyl-1,3-propanediol diglycidyl ether, 2-butyl-2-ethyl-1,3-propanediol diglycidyl ether, 1,4-butanediol diglycidyl ether (tetramethylene glycol diglycidyl ether), neopentyl glycol diglycidyl ether, 3-methyl-2,4-pentanediol diglycidyl ether, 2,4-pentanediol diglycidyl ether, 1,5-pentanediol diglycidyl ether (pentamethylene glycol diglycidyl ether), 3-methyl-1,5-pentanediol diglycidyl ether, 2-methyl-2,4-pentanediol diglycidyl ether, 2,4-diethyl-1,5-pentanediol diglycidyl ether, 1,6-hexanediol diglycidyl ether (hexamethylene glycol diglycidyl ether), 1,7-heptanediol diglycidyl ether, 3,5-heptanediol diglycidyl ether, 1,8-octanediol diglycidyl ether, 2-methyl-1,8-octanediol diglycidyl ether, and 1,9-nonanediol diglycidyl ether. From the perspectives of improving the reactivity and the surface hardness, bendability and bending resistance of the cured product (resin layer) and preventing deterioration of the antifouling performance, 1,6-hexanediol diglycidyl ether is preferred.

In the curable composition according to the present disclosure, one type of the compound B can be used alone, or two or more types thereof can be used in combination. The compound B can be produced by a known method. As the compound B, for example, a commercially available product of trade name "Epolight 1600" (available from Kyoeisha Chemical Co., Ltd.) can also be used.

A content (blended amount) of the compound B in the curable composition according to the present disclosure is not particularly limited, but is preferably from 1 to 50 parts by weight, more preferably from 1.5 to 40 parts by weight, even more preferably from 2 to 30 parts by weight, particularly preferably from 3 to 20 parts by weight, and most preferably from 5 to 15 parts by weight, relative to 100 parts by weight of the polyorganosilsesquioxane according to the present disclosure. When the content of the compound B is set to not less than 1 part by weight, the bendability and bending resistance of the cured product (resin layer) tend to be improved, and the antifouling performance tends to be hardly deteriorated. On the other hand, when the content of the compound B is set to not less than 50 parts by weight, the surface hardness of the resulting cured product (resin layer) tends to be maintained.

The ratio of the contents of the compound A and the compound B in the curable composition according to the present disclosure (compound A/compound B; weight ratio) is, for example, from 1/0.5 to 1/10, preferably from 1/1 to 1/7, particularly preferably from 1/2 to 1/6, and most preferably from 1/3 to 1/5. When the compound A and the compound B are contained in the above range, the surface hardness of the resulting cured product (resin layer) tends to be improved.

Fluorine-Containing Polymerizable Compound

The curable composition according to the present disclosure preferably contains a fluorine-containing polymerizable compound.

The fluorine-containing polymerizable compound is, for example, a fluorine-containing photopolymerizable resin. The fluorine-containing photopolymerizable resin is a resin (oligomer) having, per molecule, a fluorine-containing group including a fluoroaliphatic hydrocarbon backbone, and a photopolymerizable functional group. When the curable composition according to the present disclosure contains a fluorine-containing photopolymerizable resin along with the polyorganosilsesquioxane according to the present invention and the compound A, the crosslinking density of the resin layer surface when the curable composition is formed into a cured product can be effectively increased, and properties of improving the appearance such as the smoothness of the surface of the cured product (resin layer), and of improving the surface hardness, scratch resistance, and antifouling properties are imparted. In particular, this effect is made more significant by blending the fluorine-containing photopolymerizable resin along with the compound A in the curable composition according to the present disclosure.

Examples of the photopolymerizable functional group contained in the fluorine-containing photopolymerizable resin include the same "photopolymerizable functional groups" of the compound A described above. From the perspectives of scratch resistance and antifouling properties of the resin layer according to the present disclosure, the photopolymerizable functional group is preferably a (meth)acryloyl group. Note that when the fluorine-containing photopolymerizable resin has two or more photopolymerizable functional groups, these photopolymerizable functional groups may each be the same or different.

The number of the photopolymerizable functional groups per molecule of the fluorine-containing photopolymerizable resin is not particularly limited, but for example, is preferably from 1 to 5, more preferably from 1 to 3, and particularly preferably from 2 to 3.

The fluorine-containing polymerizable compound may also be a fluorine-containing radically polymerizable compound.

The fluorine-containing radically polymerizable compound is a compound having a fluorine-containing group and a radically polymerizable group. When the curable composition according to the present disclosure contains a fluorine-containing radically polymerizable compound along with the polyorganosilsesquioxane according to the present disclosure and the compound A, the fluorine-containing radically polymerizable compound is bonded to the polyorganosilsesquioxane according to the present disclosure via the compound A, thereby preventing deterioration of the antifouling performance of the cured product (resin layer).

Examples of the radically polymerizable group contained in the fluorine-containing radically polymerizable compound include the same "radically polymerizable groups" of the compound A described above. From the perspectives of scratch resistance and antifouling properties of the resin layer according to the present disclosure, the radically polymerizable group is preferably a (meth)acryloyl group.

The number of radically polymerizable groups per molecule of the fluorine-containing radically polymerizable compound is 1 or greater, and preferably 2 or greater (for example, from 2 to 5, preferably from 2 to 3). Note that when the fluorine-containing radically polymerizable compound has two or more radically polymerizable groups, these radically polymerizable groups may each be the same or different. In a case where the fluorine-containing radically polymerizable compound has two or more radically polymerizable groups, plural (meth)acryloyl groups of the fluorine-containing radically polymerizable compound are bonded to each other during curing, and thus the crosslinking density after curing is improved. The crosslinking density after curing is improved as described above, which leads to an effect of improving the scratch resistance of the resin layer.

The "fluorine-containing group" is not particularly limited as long as it has a fluorine atom, and examples thereof include those having a fluoroaliphatic hydrocarbon backbone. Examples of the fluoroaliphatic hydrocarbon backbone include fluoro $C_{1-10}$ alkanes such as fluoromethane, fluoroethane, fluoropropane, fluoroisopropane, fluorobutane, fluoroisobutane, fluoro t-butane, fluoropentane, and fluorohexane.

Any fluoroaliphatic hydrocarbon backbone may be used so long as at least some of the hydrogen atoms in the fluoroaliphatic hydrocarbon backbone are substituted by fluorine atoms, but perfluoroaliphatic hydrocarbon backbones in which all of the hydrogen atoms have been substituted by the fluorine atoms are preferred, from the perspectives of improving the scratch resistance, sliding properties, and antifouling properties of the resin layer.

Furthermore, the fluoroaliphatic hydrocarbon backbone may have a structure having a polyfluoroalkylene ether as a repeating unit. The polyfluoroalkylene ether may be, for example, at least one type selected from the group consisting of polyfluoro $C_{1-4}$ alkylene ether such as polyfluoro methylene ether, polyfluoro ethylene ether, polyfluoro propylene ether, and polyfluoro isopropylene ether. The number of repetitions of the repeating units (a degree of polymerization) is, for example, from 10 to 3000, preferably from 30 to 1000, and more preferably from 50 to 500.

The fluorine-containing polymerizable compound may have a silicone-containing group, in addition to the "fluorine-containing group", "photopolymerizable functional group" and "radically polymerizable group" described above. When the fluorine-containing polymerizable compound further includes a silicone-containing group, affinity with the polyorganosilsesquioxane according to the present disclosure is improved, and the surface hardness, scratch resistance, antifouling properties of the cured product (resin layer) tend to be further improved. The silicone-containing group is a group having a polyorganosiloxane skeleton, and any polyorganosiloxane may be used so long as it is formed from an M unit, a D unit, a T unit, or a Q unit. However, typically, a polyorganosiloxane formed from a D unit is preferably used. Typical organic groups used in the polyorganosiloxane include a $C_{1-4}$ alkyl group and aryl group, and a methyl group and a phenyl group (in particular, a methyl group) are commonly used. The number of repetitions of the siloxane units (a degree of polymerization) is, for example, 2 to 3000, preferably 3 to 2000, more preferably 5 to 1000.

Commercially available products can be used as the fluorine-containing polymerizable compound described above, and examples thereof include products of the trade names "MEGAFAC RS-56", "MEGAFAC RS-75", "MEGAFAC RS-72K", "MEGAFAC RS-76E", "MEGAFAC RS-76E", "MEGAFAC RS-76NS", "MEGAFAC RS-78", and "MEGAFAC RS-90" (the above are available from DIC Corporation); trade names "FTERGENT 601AD", "FTERGENT 601ADH2", "FTERGENT 602A", "FTERGENT 650AC", "FTERGENT 681" (the above are available from Neos Company Limited), "SUBELYN KY-1203", "SUBELYN X-71-1203E", "SUBELYN KY-1211", "SUBELYN KY-1207", "SUBELYN KY-1271" (the above are available from Shin-Etsu Chemical Co., Ltd.).

One type of these fluorine-containing polymerizable compounds may be used alone, or two or more types thereof may be used in combination.

A content (blended amount) of the fluorine-containing polymerizable compound in the curable composition according to the present disclosure is not limited, and the solid content thereof is, for example, from 0.01 to 15 parts by weight, more preferably from 0.05 to 10 parts by weight, even more preferably from 0.01 to 5 parts by weight, and yet even more preferably from 0.2 to 3 parts by weight, relative to 100 parts by weight of the polyorganosilsesquioxane according to the present disclosure. When the content of the fluorine-containing polymerizable compound is set to not less than 0.01 parts by weight, the scratch resistance and antifouling performance of the cured product (resin layer) tend to be improved, and the antifouling properties also tend to be hardly deteriorated.

As for the content of the fluorine-containing polymerizable compound and the compound A in the curable composition according to the present disclosure, the content of the "photopolymerizable functional group" or the "radically polymerizable group" included in the compound A is, for example, from 1 to 20 mol, relative to 1 mol of the "photopolymerizable functional group" or the "radically polymerizable group" included in the fluorine-containing polymerizable compound. Further, the content of the fluorine-containing polymerizable compound is, for example, from 0.05 to 0.5 parts by weight, preferably from 0.05 to 0.2 parts by weight, and particularly preferably from 0.1 to 0.2 parts by weight, relative to 1 part by weight of the compound A. When the curable composition according to the present disclosure contains the fluorine-containing polymerizable compound and the compound A in the above range, the resulting cured product (resin layer) can exhibit excellent antifouling performance and can maintain the excellent antifouling performance for a long period of time.

As to the content of the fluorine-containing polymerizable compound in the curable composition according to the present disclosure, the content of the fluorine-containing polymerizable compound is, for example, from 0.01 to 0.5 parts by weight, preferably from 0.03 to 0.2 parts by weight, and particularly preferably from 0.04 to parts by weight, relative to 1 part by weight of the compound B. When the curable composition according to the present disclosure contains the fluorine-containing polymerizable compound and the compound B in the above range, the resulting cured product (resin layer) can exhibit excellent antifouling performance and can maintain the excellent antifouling performance for a long period of time.

Curing Catalyst

The curable composition according to the present disclosure preferably further contains a curing catalyst. From the perspective of being able to shorten the curing time until the curable composition becomes tack-free, it is particularly preferable that the curable composition contains a cationic polymerization initiator and/or a radical polymerization initiator as a curing catalyst.

The cationic polymerization initiator is a compound capable of initiating and/or accelerating a cationic polymerization reaction of a cationically curable compound such as the polyorganosilsesquioxane according to the present disclosure. The cationic polymerization initiator is not particularly limited, and examples thereof include photocationic polymerization initiators (photo acid generating agents) and thermal cationic polymerization initiators (thermal acid generating agents).

Known or commonly used photocationic polymerization initiators can be used as the photocationic polymerization initiator, and examples thereof include a sulfonium salt (a salt of a sulfonium ion and an anion), an iodonium salt (a salt of an iodonium ion and an anion), a selenium salt (a salt of a selenium ion and an anion), an ammonium salt (a salt of an ammonium ion and an anion), a phosphonium salt (a salt of a phosphonium ion and an anion), and a salt of a transition metal complex ion and an anion. One of these can be used individually, or two or more in combination.

Examples of the sulfonium salt include a triarylsulfonium salt, such as [4-(4-biphenylylthio)phenyl]-4-biphenylylphenyl sulfonium tris(pentafluoroethyl) trifluorophosphate, a triphenylsulfonium salt, a tri-p-tolylsulfonium salt, a tri-o-tolylsulfonium salt, a tris(4-methoxyphenyl)sulfonium salt, a 1-naphthyldiphenylsulfonium salt, a 2-naphthyldiphenylsulfonium salt, a tris(4-fluorophenyl)sulfonium salt, a tri-1-naphthylsulfonium salt, a tri-2-naphthylsulfonium salt, a tris(4-hydroxyphenyl)sulfonium salt, a diphenyl[4-(phenylthio)phenyl]sulfonium salt, and a 4-(p-tolylthio)phenyl di-(p-phenyl) sulfonium salt; a diarylsulfonium salt, such as a diphenylphenacylsulfonium salt, a diphenyl 4-nitrophenacylsulfonium salt, a diphenylbenzylsulfonium salt, and a diphenylmethylsulfonium salt; a monoarylsulfonium salt, such as a phenylmethylbenzylsulfonium salt, a 4-hydroxyphenylmethylbenzylsulfonium salt, and a 4-methoxyphenylmethylbenzylsulfonium salt; and a trialkylsulfonium salt, such as a dimethylphenacylsulfonium salt, a phenacyltetrahydrothiophenium salt, and a dimethylbenzylsulfonium salt.

As the diphenyl [4-(phenylthio)phenyl]sulfonium salt, for example, diphenyl[4-(phenylthio)phenyl]sulfonium hexafluoroantimonate and (diphenyl[4-(phenylthio)phenyl] sulfonium hexafluorophosphate can be used.

Examples of the iodonium salt include "UV9380C" (trade name, a bis(4-dodecylphenyl) iodonium=hexafluoroantimonate 45% alkyl glycidyl ether solution, available from Momentive Performance Materials Japan LLC), "RHODORSIL PHOTOINITIATOR 2074" (trade name, tetrakis(pentafluorophenyl)borate=[(1-methylethyl)phenyl](methylphenyl)iodonium, available from Rhodia Japan Ltd.), "WPI-124" (trade name, available from Wako Pure Chemical Industries, Ltd.), a diphenyliodonium salt, a di-p-tolyliodonium salt, a bis(4-dodecylphenyl)iodonium salt, and a bis(4-methoxyphenyl)iodonium salt.

Examples of the selenium salt include a triarylselenium salt, such as a triphenylselenium salt, a tri-p-tolylselenium salt, a tri-o-tolylselenium salt, a tris(4-methoxyphenyl)selenium salt, and a 1-naphthyldiphenylselenium salt; a diarylselenium salt, such as a diphenylphenacylselenium salt, a diphenylbenzylselenium salt, and a diphenylmethylselenium salt; a monoarylselenium salt, such as a phenylmethylbenzylselenium salt; and a trialkylselenium salt, such as a dimethylphenacylselenium salt.

Examples of the ammonium salt include a tetraalkyl ammonium salt, such as a tetramethyl ammonium salt, an ethyltrimethyl ammonium salt, a diethyldimethyl ammonium salt, a triethylmethyl ammonium salt, a tetraethyl ammonium salt, a trimethyl-n-propyl ammonium salt, and a trimethyl-n-butyl ammonium salt; a pyrrolidium salt, such as an N,N-dimethylpyrrolidium salt and an N-ethyl-N-methylpyrrolidium salt; an imidazolinium salt, such as an N,N'-dimethylimidazolinium salt and an N,N'-diethylimidazolinium salt; a tetrahydropyrimidium salt, such as an N,N'-dimethyltetrahydropyrimidium salt and an N,N'-diethyltetrahydropyrimidium salt; a morpholinium salt, such as an N,N-dimethylmorpholinium salt and an N,N-diethylmorpholinium salt; a piperidinium salt, such as an N,N-dimethylpiperidinium salt and an N,N-diethylpiperidinium salt; a pyridinium salt, such as an N-methylpyridinium salt and an N-ethylpyridinium salt; an imidazolium salt, such as an N,N'-dimethylimidazolium salt; a quinolium salt, such as an N-methylquinolium salt; an isoquinolium salt, such as an N-methylisoquinolium salt; a thiazonium salt, such as a benzylbenzothiazonium salt; and an acrydium salt, such as a benzylacrydium salt.

Examples of the phosphonium salt include a tetra-arylphosphonium salt, such as a tetra-phenylphosphonium salt, a tetra-p-tolylphosphonium salt, and a tetrakis(2-methoxyphenyl)phosphonium salt; a triarylphosphonium salt, such as a triphenylbenzylphosphonium salt; and a tetra-alkylphosphonium salt, such as a triethylbenzylphosphonium salt, a tributylbenzylphosphonium salt, a tetra-ethylphosphonium salt, a tetra-butylphosphonium salt, and a triethylphenacylphosphonium salt.

Examples of the salt of the transition metal complex ion include a salt of a chromium complex cation, such as (η5-cyclopentadienyl)(η6-toluene)$Cr^+$ and (η5-cyclopentadienyl)(η6-xylene)$Cr^+$; and a salt of an iron complex cation, such as (η5-cyclopentadienyl)(η6-toluene)$Fe^+$ and (η5-cyclopentadienyl)(η6-xylene)$Fe^+$.

Examples of the anion constituting the salt described above include $SbF_6^-$, $PF_6^-$, $BF_4^-$, $(CF_3CF_2)_3PF_3^-$, $(CF_3CF_2CF_2)_3PF_3^-$, $(C_6F_5)_4B^-$, $(C_6F_5)_4Ga^-$, a sulfonate anion (such as a trifluoromethanesulfonate anion, a pentafluoroethanesulfonate anion, a nonafluorobutanesulfonate anion, a methanesulfonate anion, a benzenesulfonate anion, and a p-toluenesulfonate anion), $(CF_3SO_2)_3C^-$, $(CF_3SO_2)_2N^-$, a perhalogenate ion, a halogenated sulfonate ion, a sulfate ion, a carbonate ion, an aluminate ion, a hexafluorobismuthate ion, a carboxylate ion, an arylborate ion, a thiocyanate ion, and a nitrate ion.

Examples of the thermal cationic polymerization initiator include arylsulfonium salts, aryliodonium salts, allene-ion complexes, quaternary ammonium salts, aluminum chelates, and boron trifluoride amine complexes.

Examples of the arylsulfonium salt include hexafluoroantimonate salts and the like. In the curable composition according to the present disclosure, commercially available products, such as "SP-66" and "SP-77" (product names, available from ADEKA Corporation), "SAN-AID SI-60L", "SAN-AID SI-80 L", "SAN-AID SI-100L" and "SAN-AID SI-150 L" (product names, available from Sanshin Chemical Industry Co., Ltd.), can be used. Examples of the aluminum chelate include ethylacetoacetate aluminum diisopropylate and aluminum tris(ethylacetoacetate). Examples of the boron trifluoride amine complex include a boron trifluoride monoethyl amine complex, a boron trifluoride imidazole complex, and a boron trifluoride piperidine complex.

In the curable composition according to the present disclosure, one type of the cationic polymerization initiator can be used alone, or two or more types thereof can be used in combination. From the perspectives of improving the surface hardness, bendability, and bending resistance, and preventing deterioration of the antifouling performance, a photocationic polymerization initiator is preferred, and a sulfonium salt is more preferred.

The radical polymerization initiator is a compound that can initiate or accelerate a radical polymerization reaction of the compound A or the fluorine-containing polymerizable compound. The radical polymerization initiator is not particularly limited, and examples thereof include photoradical polymerization initiators and thermal radical polymerization initiators.

As the photoradical polymerization initiator, known or commonly used photoradical polymerization initiators can be used, and examples thereof include α-hydroxyketone, α-aminoketone, benzyl ketal, bisacylphosphine oxide, and metallocene. One of these can be used individually, or two or more in combination.

Examples of the α-hydroxyketone include 2-hydroxy-2-methyl-1-phenyl-propan-1-one (e.g., product name: Darocur (Trade name) 1173, available from IGM RESINS), 2-hydroxy-1-{4-[4-(2-hydroxy-2-methyl-propionyl)-benzyl]phenyl}-2-methyl-propan-1-one (e.g., product name: Omnirad (Trade name) 127, available from IGM RESINS), 1-[4-(2-hydroxyethoxy)-phenyl]-2-hydroxy-2-methyl-1-propan-1-one (e.g., product name: Omnirad (Trade name) 2959, available from IGM RESINS), 2,2-dimethoxy-1,2-diphenylethane-1-one (e.g., product name: Omnirad (Trade name) 651, available from IGM RESINS), and 1-hydroxy-cyclohexyl-phenyl-ketone (e.g., product name: Omnirad (Trade name) 184, available from IGM RESINS).

Examples of the α-aminoketone include 2-methyl-1-(4-methylthiophenyl)-2-morpholinopropan-1-one (e.g., product name: Omnirad (Trade name) 907, available from IGM RESINS) and 2-benzyl-2-dimethylamino-1-(4-morpholinophenyl)-butane-1-one (e.g., product name: Omnirad (Trade name) 369, available from IGM RESINS).

Examples of the benzyl ketal include 2,2-dimethoxy-2-phenylacetophenone (e.g., product name: Omnirad (Trade name) 651, available from IGM RESINS) and oligo-{2-hydroxy-2-methyl-1-[4-(1-methylvinyl)phenyl]propanone} (e.g., Esacure (Trade name) ONE, available from Nippon Kayaku Co., Ltd.).

Examples of the bisacylphosphine oxide include bis(2,4,6-trimethylbenzoyl)phenylphosphine oxide (e.g., product name: Omnirad (Trade name) 819, available from IGM RESINS).

Examples of the thermal radical polymerization initiator include azo-based polymerization initiators, peroxide-based polymerization initiators, and redox-based polymerization initiators. One of these can be used individually, or two or more in combination.

Examples of the azo-based polymerization initiator include 2,2'-azobisisobutyronitrile (AIBN), 2,2'-azobis-2-methylbutyronitrile (AMBN), 2,2'-azobis(2-methylpropionic acid)dimethyl, 4,4'-azobis-4-cyanovaleric acid, 2,2'-azobis(4-methoxy-2,4-dimethylvaleronitrile), 2,2'-azobis(2,4-dimethylvaleronitrile), 1,1'-azobis(cyclohexane-1-carbonitrile), and 2,2'-azobis(2,4,4-trimethylpentane). Examples of the peroxide-based polymerization initiator include benzoyl peroxide, t-butyl hydroperoxide, di-t-butyl peroxide, t-butyl peroxy benzoate, dicumyl peroxide, 1,1-bis(t-butylperoxy)-3,3,5-trimethylcyclohexane, and 1,1-bis(t-butylperoxy)cyclododecane.

In the curable composition according to the present disclosure, one type of the radical polymerization initiator can be used alone, or two or more types thereof can be used in combination. From the perspectives of improving the surface hardness, bendability, and bending resistance, and preventing deterioration of the antifouling performance, a photoradical polymerization initiator is preferred, an α-hydroxyketone is more preferred, and 2-hydroxy-1-{4-[4-(2-hydroxy-2-methyl-propionyl)-benzyl]phenyl}-2-methyl-propan-1-one is particularly preferred.

In the curable composition according to the present disclosure, one type of the curing catalyst can be used alone, or two or more types thereof can be used in combination.

From the perspectives of improving the surface hardness, the bendability, and the bending resistance, and preventing deterioration of the antifouling performance, a cationic polymerization initiator and/or a photoradical polymerization initiator are preferred as the curing catalyst, and an aspect of using a cationic polymerization initiator and a photoradical polymerization initiator in combination is more preferred.

A content (blended amount) of the cationic polymerization initiator is not particularly limited, but is preferably from 0.01 to 3.0 parts by weight, more preferably from 0.05 to 3.0 parts by weight, even more preferably from 0.1 to 1.0 part by weight (e.g., from 0.3 to 1.0 part by weight), relative to 100 parts by weight of the polyorganosilsesquioxane according to the present disclosure. When the content of the cationic polymerization initiator is set to 0.01 part by weight or greater, the curing reaction can be efficiently and sufficiently advanced, and the surface hardness, bendability, and bending resistance of the cured product (resin layer) tend to be improved, and the antifouling performance tends to be hardly deteriorated. On the other hand, when the content of the cationic polymerization initiator is set to 3.0 parts by weight or less, the storage stability of the curable composition tends to be further improved, and the coloration of the cured product (resin layer) tends to be suppressed.

A content (blended amount) of the radical polymerization initiator is not particularly limited, but is preferably from 0.01 to 1.0 part by weight, more preferably from 0.05 to 0.5 parts by weight, and more preferably from 0.1 to 0.3 parts by weight, relative to 100 parts by weight of the polyorganosilsesquioxane according to the present disclosure.

In addition, the content (blended amount) of the radical polymerization initiator is preferably from 0.1 to 5.0 parts by weight, more preferably from 0.5 to 3.0 parts by weight, and even more preferably from 1.0 to 2.0 parts by weight, relative to 10 parts by weight of the compound A.

When the content of the radical polymerization initiator is set to 0.01 part by weight or greater, the curing reaction can be efficiently and sufficiently advanced, and the surface hardness, bendability, and bending resistance of the cured product (resin layer) tend to be improved, and the antifouling performance tends to be hardly deteriorated. On the other hand, when the content of the radical polymerization initiator is set to 1.0 part by weight or less, the storage stability of the curable composition tends to be further improved, and the coloration of the cured product (resin layer) tends to be suppressed.

When the cationic polymerization initiator and the radical polymerization initiator are used in combination, the total content (total blended amount) thereof is not particularly limited, but is preferably from 0.01 to 4.0 parts by weight, more preferably from 0.05 to 3.0 parts by weight, and even more preferably from 0.1 to 2.0 (e.g., from 0.3 to 1.5 parts by weight), relative to 100 parts by weight of the polyorganosilsesquioxane according to the present disclosure. When the above total content is set to 0.01 part by weight or greater, the curing reaction can be efficiently and sufficiently advanced, and the surface hardness, bendability, and bending resistance of the cured product (resin layer) tend to be improved, and the antifouling performance tends to be hardly deteriorated. On the other hand, when the above total content is set to 4.0 parts by weight or less, the storage stability of the curable composition tends to be further improved, and the coloration of the cured product (resin layer) tends to be suppressed.

When the cationic polymerization initiator and the radical polymerization initiator are used in combination, the amount of the radical polymerization initiator to be used is not particularly limited, but is preferably from 10 to 90 parts by weight, more preferably from 20 to 70 parts by weight, and even more preferably from 30 to parts by weight, relative to 100 parts by weight of the cationic polymerization initiator. When the amount of the radical polymerization initiator to be used relative to the cationic polymerization initiator is set to 10 parts by weight or greater, the curing reaction can be efficiently and sufficiently advanced, and the surface hardness, bendability, and bending resistance of the cured product (resin layer) tend to be improved, and the antifouling performance tends to be hardly deteriorated. On the other hand, when the amount of the radical polymerization initiator to be used is set to parts by weight or less, the storage stability of the curable composition tends to be further improved, and the coloration of the cured product (resin layer) tends to be suppressed.

Antioxidant

The curable composition according to the present disclosure may further contain an antioxidant. The inclusion of an antioxidant in the curable composition according to the present disclosure tends to further improve the storage stability of the cured product (resin layer).

The antioxidant is not particularly limited, and a known or commonly used antioxidant can be used, and examples thereof include phenol-based antioxidants (phenol-based compounds), hindered amine-based antioxidants (hindered amine-based compounds), phosphorus-based antioxidants (phosphorus-based compounds), and sulfur-based antioxidants (sulfur-based compounds).

Examples of the phenol-based antioxidants include monophenols such as 2,6-di-t-butyl-p-cresol, butylated hydroxyanisole, 2,6-di-t-butyl-p-ethylphenol, and stearyl-β-(3,5-di-t-butyl-4-hydroxyphenyl) propionate; bis-phenols such as 2,2'-methylene-bis(4-methyl-6-t-butylphenol), 2,2'-methylene-bis(4-ethyl-6-t-butylphenol), 4,4'-thio-bis(3-methyl-6-t-butylphenol), 4,4'-butylidene bis(3-methyl-6-t-butylphenol), and 3,9-bis[1,1-dimethyl-2-{β-(3-t-butyl-4-hydroxy-5-methylphenyl)propionyloxy}ethyl]2,4,8,10-tetraoxaspiro[5.5]undecane; and polymeric phenols such as 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis[methylene-3-(3',5'-di-t-butyl-4'-hydroxyphenyl)propionate]methane, bis[3,3'-bis-(4'-hydroxy-3'-t-butylphenyl)butyric acid]glycol ester, 1,3,5-tris(3',5'-di-t-butyl-4'-hydroxybenzyl)-s-triazine-2,4,6-(1H,3H,5H)trione, and tocopherol.

Examples of the hindered amine-based antioxidants include bis (1,2,2,6,6-pentamethyl-4-piperidyl)[[3,5-bis(1,1-dimethyl ethyl)-4-hydroxyphenyl]methyl]butyl malonate, bis (1,2,2,6,6-pentamethyl-4-piperidyl) sebacate, methyl-1,2,2,6,6-pentamethyl-4-piperidyl sebacate, and 4-benzoyloxy-2,2,6,6-tetramethylpiperidine.

Examples of the phosphorus-based antioxidant include phosphites such as triphenyl phosphite, diphenylisodecyl phosphite, phenyldiisodecyl phosphite, tris (nonylphenyl) phosphite, diisodecyl pentaerythritol phosphite, tris (2,4-di-t-butylphenyl) phosphite, cyclic neopentanetetraylbis (octadecyl) phosphite, cyclic neopentanetetraylbis (2,4-di-t-butylphenyl) phosphite, cyclic neopentanetetraylbis (2,4-di-t-butyl-4-methylphenyl) phosphite, and bis [2-t-butyl-6-methyl-4-{2-(octadecyloxycarbonyl)ethyl}phenyl] hydrogen phosphite; and oxaphosphaphenanthrene oxides such as 9,10-dihydro-9-oxa-10-phosphaphenanthrene-10-oxide, and 10-(3,5-di-t-butyl-4-hydroxybenzyl)-9,10-dihydro-9-oxa-10-phosphaphenanthrene-10-oxide.

Examples of the sulfur-based antioxidant include dodecanethiol, dilauryl-3,3'-thiodipropionate, dimyristyl-3,3'-thiodipropionate, and distearyl-3,3'-thiodipropionate.

In the curable composition according to the present disclosure, one type of the antioxidant can be used alone, or two or more types thereof can be used in combination. Also, as the antioxidant, examples of commercially available phenol-based antioxidants include products of the trade names "Irganox 1010", "Irganox 1076", "Irganox 1098", "Irganox 1330", "Irganox 245", "Irganox 259", "Irganox 3114", and "Irganox 3790" (the above are available from BASF); and products of the trade names "ADK Stab AO-60", "ADK Stab AO-20", "ADK Stab AO-30", "ADK Stab AO-40", and "ADK Stab AO-80" (the above are available from ADEKA Corporation). Furthermore, examples of commercially available products of phosphorus-based antioxidants include products of the trade names "Irgafos 168," "Irgafos P-EPQ," and "Irgafos 12" (the above are available from BASF); products of the trade names "ADK Stab HP-10", "ADK Stab TPP", "ADK Stab C", "ADK Stab 517", "ADK Stab 3010," "ADK Stab PEP-24G", "ADK Stab PEP-4C," "ADK Stab PEP-36," "ADK Stab PEP-45," "ADK Stab 1178," "ADK Stab 135A", "ADK Stab 1178", "ADK Stab PEP-8", "ADK Stab 329K", "ADK Stab 260", "ADK Stab 522A", and "ADK Stab 1500" (the above are available from ADEKA Corporation); products of the trade names "GSY-P101", "Chelex-OL", and "Chelex-PC" (the above are available from Sakai Chemical Industry Co., Ltd.); products of the trade names "JP302", "JP304", "JPM313", "JP308", "JPP100", "JPS312", "JP318E", "JP333E", "JPH1200", and "HBP" (the above are available from Johoku Chemical Co., Ltd.); and product of the trade name "SANKO-HCA" (available from Sanko Co., Ltd.).

Of these, as the antioxidant, phenol-based antioxidants, phosphorus-based antioxidants, and sulfur-based antioxidants are preferable, and phenol-based antioxidants are particularly preferable.

When the curable composition according to the present disclosure contains an antioxidant, a content (blended amount) thereof is not particularly limited, but is preferably from 0.05 to 5 parts by weight, and more preferably from 0.1 to 3 parts by weight, relative to 100 parts by weight of the polyorganosilsesquioxane according to the present disclosure. When the content of the antioxidant is less than 0.05 parts by weight, the stability of the cured product (resin layer) may be insufficient. On the other hand, when the content of the antioxidant exceeds 5 parts by weight, the cured product (coating film) may become prone to coloration.

Additional Curable Compound

The curable composition according to the present disclosure may include, as a curable compound, an additional curable compound other than the polyorganosilsesquioxane according to the present disclosure, the compound A, and the compound B, and may include, for example, an epoxy compound (which may be hereinafter referred to as "additional epoxy compound") other than the polyorganosilsesquioxane according to the present disclosure, the compound A, and the compound B.

The inclusion of an additional epoxy compound in the curable composition according to the present disclosure makes it possible to form a cured product (resin layer) having a high level of surface hardness and being excellent in flexibility, flexuosity, and processability.

For the additional epoxy compound described above, a known or commonly used compound having one or more epoxy groups (oxirane rings) per molecule can be used. The epoxy compound is not particularly limited, and the examples thereof include alicyclic epoxy compounds (alicyclic epoxy resins), and aromatic epoxy compounds (aromatic epoxy resins). Among them, alicyclic epoxy compounds are preferred.

For the alicyclic epoxy compound, examples include known or commonly used compounds that have one or more alicyclic rings and one or more epoxy groups in the molecule. Such an alicyclic epoxy compound is not particularly limited, and the examples thereof include (1) a compound including an epoxy group (referred to as an "alicyclic epoxy group") constituted of two adjacent carbon atoms and an oxygen atom that constitute an alicyclic ring in the molecule; (2) a compound in which an epoxy group is directly bonded to an alicyclic ring via a single bond; and (3) a compound including an alicyclic ring and a glycidyl ether group in the molecule (a glycidyl ether type epoxy compound).

The compound (1) including an alicyclic epoxy group in the molecule can be optionally selected from known and commonly used compounds and used. In particular, the alicyclic epoxy group is preferably a cyclohexene oxide group, and particularly preferably a compound represented by Formula (i) below:

[Chem. 20]

(i)

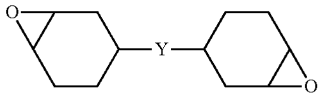

In Formula (i) above, Y represents a single bond or a linking group (a divalent group having one or more atoms). Examples of the linking group include a divalent hydrocarbon group, an epoxidized alkenylene group in which some or all of carbon-carbon double bonds are epoxidized, a carbonyl group, an ether bond, an ester bond, a carbonate group, an amide group, and a linked group in which a plurality of the above groups are linked. One or more hydrogen atoms of the cyclohexane ring in Formula (i) may be substituted with a substituent such as an alkyl group having from 1 to 6 carbons.

Examples of the divalent hydrocarbon group include a linear or branched alkylene group having from 1 to 18 carbons and a divalent alicyclic hydrocarbon group. Examples of the linear or branched alkylene group having from 1 to 18 carbons include a methylene group, a methyl methylene group, a dimethyl methylene group, an ethylene group, a propylene group, and a trimethylene group. Examples of the divalent alicyclic hydrocarbon group include a divalent cycloalkylene group (including a cycloalkylidene group), such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group.

Examples of the alkenylene group in the alkenylene group in which some or all of the carbon-carbon double bonds are epoxidized (which may be referred to as an "epoxidized alkenylene group") include linear or branched alkenylene groups having from 2 to 8 carbons, such as a vinylene group, a propenylene group, a 1-butenylene group, a 2-butenylene group, a butadienylene group, a pentenylene group, a hexenylene group, a heptenylene group, and an octenylene group. In particular, the epoxidized alkenylene group is preferably an epoxidized alkenylene group in which all of the carbon-carbon double bonds are epoxidized, and more preferably an epoxidized alkenylene group having from 2 to 4 carbons in which all of the carbon-carbon double bonds are epoxidized.

Representative examples of the alicyclic epoxy compound represented by Formula (i) above include (3,4,3',4'-diepoxy)bicyclohexyl and compounds represented by Formulae (i-1) to (i-10) below. In Formulae (i-5) and (i-7), l and m each represent an integer from 1 to 30. R' in Formula (i-5) below is an alkylene group having from 1 to 8 carbons, and, among these, a linear or branched alkylene group having from 1 to 3 carbons, such as a methylene group, an ethylene group, a propylene group, or an isopropylene group, is preferred. In Formulae (i-9) and (i-10), n1 to n6 each represent an integer from 1 to 30. In addition, examples of the alicyclic epoxy compound represented by Formula (i) above include 2,2-bis(3,4-epoxycyclohexyl)propane, 1,2-bis(3,4-epoxycyclohexyl)ethane, 2,3-bis(3,4-epoxycyclohexyl)oxirane, and bis(3,4-epoxycyclohexylmethyl)ether.

[Chem. 21]

(i-1)

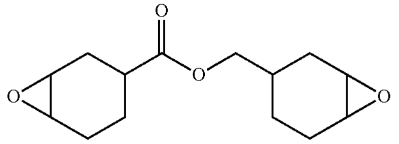

(i-2)

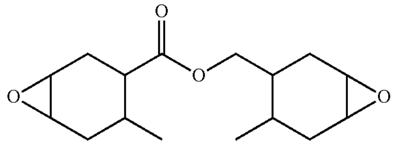

(i-3)

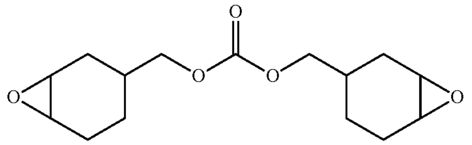

(i-4)

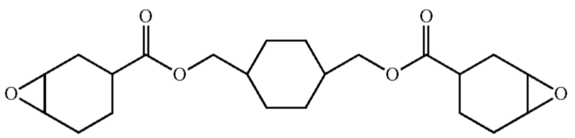

(i-5)

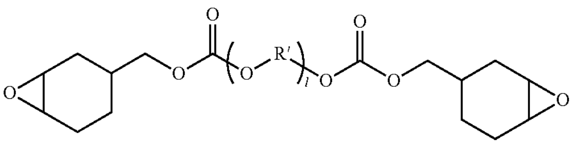

(i-6)

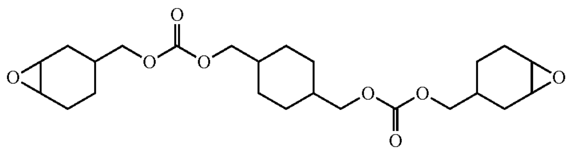

-continued (i-7)

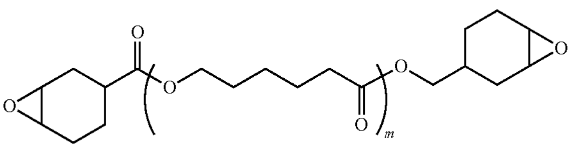

(i-8)

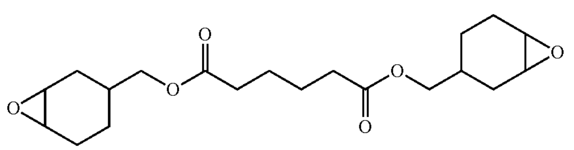

[Chem. 22]

(i-9)

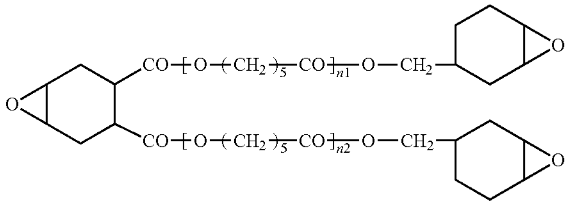

(i-10)

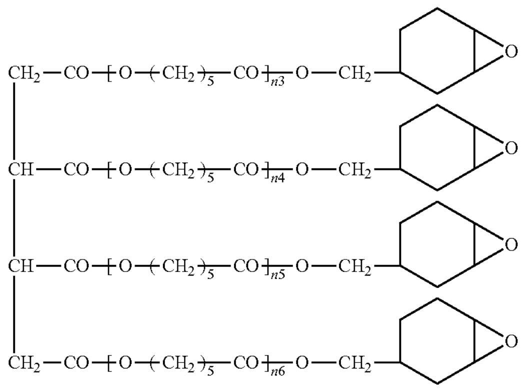

Examples of the compound (2) described above in which an epoxy group is directly bonded to an alicyclic ring via a single bond include a compound represented by Formula (ii) below.

[Chem. 23]

(ii)

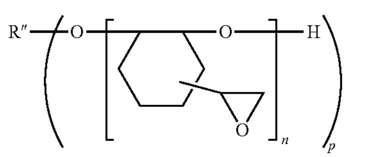

In Formula (ii), R" is a group (p-valent organic group) resulting from elimination of p hydroxyl groups (—OH) from a structural formula of a p-valent alcohol, wherein p and n each represent a natural number. Examples of the p-valent alcohol [R"$(OH)_p$] include polyhydric alcohols (such as alcohols having from 1 to 15 carbons), such as 2,2-bis(hydroxymethyl)-1-butanol. Here, p is preferably from 1 to 6, and n is preferably from 1 to 30. When p is 2 or greater, n in each group in parentheses (in the outer parentheses) may be the same or different. Examples of the compound represented by Formula (ii) above specifically include 1,2-epoxy-4-(2-oxiranyl)cyclohexane adduct of 2,2-bis(hydroxymethyl)-1-butanol [e.g., the trade name "EHPE3150" (available from Daicel Corporation) or the like].

Examples of the compound (3) described above including an alicyclic ring and a glycidyl ether group in the molecule include glycidyl ethers of alicyclic alcohols (in particular, alicyclic polyhydric alcohols). More particularly, examples thereof include compounds obtained by hydrogenating a bisphenol A type epoxy compound (a hydrogenated bisphenol A type epoxy compound), such as 2,2-bis[4-(2,3-epoxypropoxy)cyclohexyl]propane and 2,2-bis[3,5-dimethyl-4-(2,3-epoxypropoxy)cyclohexyl]propane; compounds obtained by hydrogenating a bisphenol F type epoxy compound (a hydrogenated bisphenol F type epoxy compound), such as bis[o,o-(2,3-epoxypropoxy)cyclohexyl]methane, bis[o,p-(2,3-epoxypropoxy)cyclohexyl]methane, bis[p,p-(2,3-epoxypropoxy)cyclohexyl]methane, and bis[3,5-dimethyl-4-(2,3-epoxypropoxy)cyclohexyl]methane; a hydrogenated bisphenol type epoxy compound; a hydrogenated phenol novolac type epoxy compound; a hydrogenated cresol novolac type epoxy compound; a hydrogenated cresol novolac type epoxy compound of bisphenol A; a hydrogenated naphthalene type epoxy compound; a hydrogenated epoxy compound of an epoxy compound obtained from trisphenolmethane; and a hydrogenated epoxy compound of an aromatic epoxy compound described below.

Examples of the aromatic epoxy compound include an epibis type glycidyl ether type epoxy resin obtained by a condensation reaction of bisphenols (e.g., bisphenol A, bisphenol F, bisphenol S, and fluorenebisphenol) and an epihalohydrin; a high molecular weight epibis type glycidyl ether type epoxy resin obtained by further subjecting the above epibis type glycidyl ether type epoxy resin to an addition reaction with the bisphenol described above; a novolac alkyl type glycidyl ether type epoxy resin obtained by subjecting a phenol (e.g., phenol, cresol, xylenol, resorcin, catechol, bisphenol A, bisphenol F, and bisphenol S) and an aldehyde (e.g., formaldehyde, acetaldehyde, benzaldehyde, hydroxybenzaldehyde, and salicylaldehyde) to a condensation reaction to obtain a polyhydric alcohol, and then further subjecting the polyhydric alcohol to condensation reaction with epihalohydrin; and an epoxy compound in which two phenol backbones are bonded at the 9-position of the fluorene ring, and glycidyl groups are each bonded directly or via an alkyleneoxy group to an oxygen atom resulting from eliminating a hydrogen atom from a hydroxyl group in these phenol backbones.

One type of the additional epoxy compound can be used alone, or two or more types thereof can be used in combination. As the additional epoxy compound, the alicyclic epoxy compound is preferred, the compound (2) in which an epoxy group is directly bonded to an alicyclic ring via a single bond is more preferred, and the compound represented by Formula (ii) above [e.g., trade name "EHPE3150" (available from Daicel Corporation) or the like] is particularly preferred from the perspectives of surface hardness, bendability, bending resistance, and the like of the cured product (resin layer).

A content (blended amount) of the additional epoxy compound is, for example, from 0.5 to 100 parts by weight, preferably from 1 to 80 parts by weight, and more preferably from 5 to 50 parts by weight, relative to 100 parts by weight of the polyorganosilsesquioxane according to the present disclosure. In a case where the content of the additional epoxy compound is set to 0.5 parts by weight or greater, the surface hardness of the cured product (resin layer) tends to be increased, and the flexibility, flexuosity, processability, and bending resistance tend to become excellent. On the other hand, in a case where the content of the additional epoxy compound is set to 100 parts by weight or less, the scratch resistance of the cured product tends to be further improved.

Silica Particles Including Group Containing (Meth)Acryloyl Group on Surface

The curable composition according to the present disclosure preferably includes silica particles including a group containing a (meth)acryloyl group on the surface. An infinite number of hydroxyl groups (Si—OH groups) are present on the surface of the silica particles, and the silica particles improve the crosslinking density of the polyorganosilsesquioxane after curing through a reaction of the hydroxyl groups and the polyorganosilsesquioxane according to the present disclosure during curing. In addition, (meth)acryloyl groups in a plurality of the silica particles bind to each other during curing, thereby improving the crosslinking density after curing. The crosslinking density after curing is improved as described above, as a result of which the scratch resistance of the resin layer is improved. Further, the formation of a layer (functional layer) having a function such as antifouling properties or low reflectivity on the resin layer causes the adhesibility between the resin layer and the functional layer to be weak, so peeling of the functional layer may occur, and so-called recoatability may not be provided. However, the use of the silica particles makes it possible to provide recoatability and to improve processability (processing suitability) during forming the functional layer on the surface of the resin layer.

Further, it is considered that the silica particles have a (meth)acryloyl group on the surface thereof, whereby stability can be imparted to the curable composition. The "stability" indicates that the curable composition does not show a significant increase in viscosity (gelate) or solidify due to the reaction between the silica particles and the polyorganosilsesquioxane in the preparation stage of the curable composition before curing. In a case where normal silica particles ($SiO_2$ particles) having no functional group such as a group including a (meth)acryloyl group on the surface thereof are used, the silica particles may be aggregated with each other and the curable composition may gelate. The silica particles may include a functional group on the surface thereof other than a (meth)acryloyl group (e.g., silicone-modified groups). Here, the (meth)acryloyl group is a generic term for an acryloyl group (acrylic group) and a methacryloyl group (methacrylic group).

The silica particles may be used in a dispersion liquid (dispersion) in a state of being dispersed in a known or commonly used typical dispersion medium, such as water and organic solvents. In addition, silica particles that are allowed to react with a silane coupling agent including a group containing a (meth)acryloyl group may be used as the silica particles. As the silica particles, for example, the trade names "BYK-LPX 22699", "NANOBYK-3650", "NANOBYK-3651", and "NANOBYK-3652" (all available from BYK Japan KK) can be used.

The particle size of the silica particles is, for example, from 1 to 100 nm, preferably from 3 to 50 nm, and more preferably from 5 to 30 nm.

A ratio of the silica particles including a group containing a (meth)acryloyl group on the surface thereof in the curable composition according to the present disclosure is, for example, from 0.01 to 20 parts by weight, preferably from 0.05 to 15 parts by weight, more preferably from 0.01 to 10 parts by weight, and even more preferably from 0.2 to 5 parts by weight, relative to 100 parts by weight of the polyorganosilsesquioxane according to the present disclosure. The silica particles contained in a ratio of 0.01 parts by weight or greater can improve the surface appearance of the resin layer, and provide sufficient recoatability. In addition, the silica particles contained in a ratio of 20 parts by weight or less can increase the surface hardness of the resin layer.

Silicon Acrylate

The curable composition according to the present disclosure may include a "silicon acrylate". The silicon acrylate (silicone acrylate) is a type of additive including at least a silicon atom and a (meth)acryloyl group. The silicon acrylate may include a functional group other than a (meth) acryloyl group (for example, a hydroxyl group). The silicon acrylate may be silicon diacrylate, silicon triacrylate, silicon tetraacrylate, silicon pentaacrylate, silicon hexacrylate, silicon heptaacrylate, or silicon octaacrylate. The silicon acrylate, used together with the polyorganosilsesquioxane in a curable composition, has properties capable of effectively increasing the crosslinking density of the resin layer surface of the resulting resin layer, improving the appearance, such as surface smoothness, of the resin layer, and improving the surface hardness, scratch resistance, and antifouling properties. Here, the (meth)acryloyl group is a generic term for an acryloyl group (acrylic group) and a methacryloyl group (methacrylic group).

The silicon acrylate may be used in a dispersion liquid (dispersion) in a state of being dispersed in a known or commonly used typical dispersion medium, such as organic solvents (for example, acetone, toluene, methanol, and ethanol). As the silicon acrylate, for example, the trade names "KRM8479", "EBECRYL 350", and "EBECRYL 1360" (available from Daicel-Allnex Ltd.) can be used.

When the curable composition according to the present disclosure includes the silicon acrylate, a ratio of the silicon acrylate is, for example, from 0.01 to 15 parts by weight, preferably from 0.05 to 10 parts by weight, more preferably from 0.01 to 5 parts by weight, and even more preferably from 0.2 to 3 parts by weight, relative to 100 parts by weight of the polyorganosilsesquioxane. The silicon acrylate contained in a ratio of 0.01 part by weight or greater can improve the scratch resistance and antifouling properties of the resulting resin layer. In addition, the silicon acrylate contained in a ratio of 15 parts by weight or less can increase the surface hardness of the resulting resin layer.

Both the silicon acrylate and the silica particles including a group containing a (meth)acryloyl group on the surface are preferably used in terms of further improving the appearance of the resin layer, increasing the surface hardness, and improving the scratch resistance. A ratio of a total of the silicon acrylate and the silica particles when both the silicon acrylate and the silica particles are contained is, for example, from to 20 parts by weight, preferably from 0.05 to 15 parts by weight, more preferably from 0.01 to 10 parts by weight, and even more preferably from 0.2 to 5 parts by weight, relative to 100 parts by weight of the polyorganosilsesquioxane. When the above ratio is set to 0.01 part by weight or greater, the scratch resistance of the resulting resin layer can be improved. Further, when the above ratio is set to 20 parts by weight or less, the surface hardness of the resulting resin layer can be further increased.

Leveling Agent

The curable composition according to the present disclosure may include a leveling agent. Examples of the leveling agent include silicone-based leveling agents, fluorine-based leveling agents, and silicone-based leveling agents including a hydroxyl group. However, the leveling agent does not include the above-described fluorine-containing polymerizable compound.

Commercially available silicone-based leveling agents can be used as the silicone-based leveling agent. For example, products commercially available under the trade names “BYK-300”, “BYK-301/302”, “BYK-306”, “BYK-307”, “BYK-310”, “BYK-315”, “BYK-313”, “BYK-320”, “BYK-322”, “BYK-323”, “BYK-325”, “BYK-330”, “BYK-331”, “BYK-333”, “BYK-337”, “BYK-341”, “BYK-344”, “BYK-345/346”, “BYK-347”, “BYK-348”, “BYK-349”, “BYK-370”, “BYK-375”, “BYK-377”, “BYK-378”, “BYK-UV3500”, “BYK-UV3510”, “BYK-UV3570”, “BYK-3550”, “BYK-SILCLEAN3700”, and “BYK-SILCLEAN3720” (all above available from BYK Japan KK); the trade names “AC FS 180”, “AC FS 360”, and “AC S 20” (all above available from Algin Chemie); the trade names “POLYFLOW KL-400X”, “POLYFLOW KL-400HF”, “POLYFLOW KL-401”, “POLYFLOW KL-402”, “POLYFLOW KL-403”, and “POLYFLOW KL-404” (all above available from Kyoeisha Chemical Co., Ltd.); the trade names “KP-323”, “KP-326”, “KP-341”, “KP-104”, “KP-110”, and “KP-112” (all above available from Shin-Etsu Chemical Co., Ltd.); and the trade names “LP-7001”, “LP-7002”, “8032 ADDITIVE”, “57 ADDITIVE”, “L-7604”, “FZ-2110”, “FZ-2105”, “67 ADDITIVE”, “8618 ADDITIVE”, “3 ADDITIVE”, and “56 ADDITIVE” (all above available from Dow Corning Toray Co., Ltd.) can be used.

Commercially available fluorine-based leveling agents can be used as the fluorine-based leveling agent. For example, products commercially available under the trade names “Optool DSX” and “Optool DAC-HP” (all above available from Daikin Industries, Ltd.); the trade names “SURFLON S-242”, “SURFLON S-243”, “SURFLON S-420”, “SURFLON S-611”, “SURFLON S-651”, and “SURFLON S-386” (all above available from AGC Seimi Chemical Co., Ltd.); the trade name “BYK-340” (BYK Japan KK); the trade names “AC 110a” and “AC 100a” (all above available from Algin Chemie); the trade names “MEGAFAC F-114”, “MEGAFAC F-410”, “MEGAFAC F-444”, “MEGAFAC EXP TP-2066”, “MEGAFAC F-430”, “MEGAFAC F-472SF”, “MEGAFAC F-477”, “MEGAFAC F-552”, “MEGAFAC F-553”, “MEGAFAC F-554”, “MEGAFAC F-555”, “MEGAFAC R-94”, “MEGAFAC RS-72-K”, “MEGAFAC RS-75”, “MEGAFAC F-556”, “MEGAFAC EXP TF-1367”, “MEGAFAC EXP TF-1437”, “MEGAFAC F-558”, and “MEGAFAC EXP TF-1537” (all above available from DIC Corporation); the trade names “FC-4430” and “FC-4432” (all above available from Sumitomo 3M Ltd.); the trade names “FTERGENT 100”, “FTERGENT 100C”, “FTERGENT 110”, “FTERGENT 150”, “FTERGENT 150CH”, “FTERGENT A-K”, “FTERGENT 501”, “FTERGENT 250”, “FTERGENT 251”, “FTERGENT 222F”, “FTERGENT 208G”, “FTERGENT 300”, “FTERGENT 310”, and “FTERGENT 400SW” (all above available from Neos Corporation); and the trade names “PF-136A”, “PF-156A”, “PF-151N”, “PF-636”, “PF-6320”, “PF-656”, “PF-6520”, “PF-651”, “PF-652”, and “PF-3320” (all above available from Kitamura Chemicals Co., Ltd.) can be used.

Examples of the silicone-based leveling agent including a hydroxyl group include polyether modified polyorganosiloxanes obtained by introducing a polyether group into the main chain or the side chain of the polyorganosiloxane backbone (such as polydimethylsiloxanes); polyester modified polyorganosiloxanes obtained by introducing a polyester group into the main chain or the side chain of the polyorganosiloxane backbone; and silicone-modified (meth) acrylic-based resins obtained by introducing a polyorganosiloxane into a (meth)acrylic-based resin. In these leveling agents, the hydroxyl group may include a polyorganosiloxane backbone or may include a polyether group or a polyester group. Leveling agent products commercially available under the trade names, such as “BYK-370”, “BYK-SILCLEAN 3700”, and “BYK-SILCLEAN 3720”, can be used.

When the curable composition according to the present disclosure contains the leveling agent, a ratio of the leveling agent is, for example, from 0.01 to 20 parts by weight, preferably from 0.05 to 15 parts by weight, more preferably from 0.01 to 10 parts by weight, and even more preferably from 0.2 to 5 parts by weight, relative to 100 parts by weight of the polyorganosilsesquioxane according to the present disclosure. When the ratio of the leveling agent is too small, the surface smoothness of the resin layer may be deteriorated, whereas when the ratio is too large, the surface hardness of the resin layer may be deteriorated.

The curable composition according to the present disclosure may further include a commonly used additive as an additional optional component, such as an inorganic filler, such as precipitated silica, wet silica, fumed silica, calcined silica, titanium oxide, alumina, glass, quartz, aluminosilicic acid, iron oxide, zinc oxide, calcium carbonate, carbon black, silicon carbide, silicon nitride, and boron nitride; an inorganic filler obtained by treating the above filler with an organosilicon compound, such as an organohalosilane, organoalkoxysilane, and organosilazane; an organic fine powder, such as a silicone resin, an epoxy resin, and a fluororesin; a filler, such as a conductive metal powder of silver, copper, or the like, a curing auxiliary, a solvent (such as an organic solvent), a stabilizer (such as an ultraviolet absorber, a light-resistant stabilizer, a heat stabilizer, and a heavy metal inactivator), a flame retardant (such as a phosphorus-based flame retardant, a halogen-based flame retardant, and an inorganic flame retardant), a flame retardant auxiliary, a reinforcing material (such as an additional filler), a nucleating agent, a coupling agent (such as a silane coupling agent), a lubricant, a wax, a plasticizer, a mold release agent, an impact modifier, a hue modifier, a transparentizing agent, a rheology modifier (such as a fluidity modifier), a processability modifier, a colorant (such as a dye and a pigment), an antistatic agent, a dispersant, an antifoamer, a foaming preventing agent, a surface modifier (such as a slipping agent), a matting agent, an antifoamer, a foam inhibitor, a deforming agent, an antibacterial agent, a preservative, a viscosity modifier, a thickener, a photosensitizer, and a foaming agent. One type alone or two or more types of these additives in combination can be used.

Method for Producing Curable Composition

The curable composition according to the present disclosure can be prepared by, but not limited to, agitating and mixing each of the components described above at room temperature or under heating as necessary. Here, the curable composition can be used as a one-part composition, which contains each component mixed beforehand and is used as is, or alternatively, used as a multi-part (for example, two-part) composition of which two or more components having been separately stored are mixed for use in a predetermined ratio before use.

The curable composition according to the present disclosure, although not limited, is preferably liquid at normal temperature (approximately 25° C.). More specifically, a liquid of the curable composition diluted with a solvent to 20% [in particular, a curable composition (solution) of methyl isobutyl ketone in a ratio of 20 wt. %] has a viscosity at 25° C. of preferably from 300 to 20000 mPa·s, more preferably from 500 to 10000 mPa·s, and even more preferably from 1000 to 8000 mPa·s. The curable composition with the viscosity of 300 mPa·s or greater tends to further improve the heat resistance of the resin layer. On the other hand, the curable composition with the viscosity of 20000 mPa·s or less facilitates the preparation and handling of the curable composition, and tends to less likely to leave residual bubbles in the resin layer. Here, the viscosity of the curable composition is measured using a viscometer (trade name "MCR301", available from Anton Paar GmbH) under conditions: a swing angle of 5%, frequency from 0.1 to 100 (1/s), and a temperature of 25° C.

The resin layer according to the present disclosure can be produced by accelerating a cationic polymerization reaction of a cationically curable compound (such as the polyorganosilsesquioxane according to the present disclosure) included in the curable composition to cure the curable composition.

To further improve the recoatability of the resin layer, the surface of the resin layer may be subjected to a surface treatment such as a corona discharge treatment for modifying the surface by performing corona discharge irradiation, a plasma discharge treatment, an ozone exposure treatment, or an excimer treatment. Among them, the corona discharge treatment is more preferred from the perspective of easily improving the recoatability.

A corona discharge treatment is a process in which a resin layer surface is treated by generating a non-uniform electric field around a pointed electrode (needle electrode) and continuously discharging. A plasma discharge treatment is a process in which a resin layer surface is treated by generating positively and negatively charged particles activated through discharging in the atmosphere. An ozone exposure treatment is a process in which a resin layer surface is treated by generating ozone through ultraviolet irradiation using, for example, a low-pressure mercury lamp in the presence of oxygen. An excimer treatment is a process in which a resin layer surface is treated by ultraviolet irradiation or laser irradiation using an excimer lamp in a vacuum state.

Examples of the functional layer that can be provided on the resin layer include a layer having functions such as scratch resistance, wear resistance, antifouling properties (stain resistance), fingerprint resistance, and antireflection properties (low reflectivity). The functional layer is a well-known or commonly used functional layer having the functions listed above and used in a resin layer of a display device such as a mobile phone or a smartphone. Examples of the material constituting the functional layer include acrylic materials, fluorine-based materials, and silicone-based materials. Examples of the method for providing the functional layer on the resin layer include a coating method similar to that for the laminated film described below, and a method by vapor deposition, sputtering, or the like.

Method for Producing Laminated Film

The laminated film can be produced according to a known or commonly used method for producing a hard coat film, and the production method thereof is not particularly limited, but the laminated film can be produced, for example, by applying the curable composition onto at least one surface of the support, and curing the curable composition to form a resin layer.

The curing method for the resin layer can be appropriately selected from known methods, and examples thereof include a method of irradiation with active energy rays and/or heating. As the active energy rays, for example, any of infrared rays, visible rays, ultraviolet rays, X-rays, an electron beam, an α-ray, a β-ray, and a γ-ray can be used. Among these, ultraviolet rays are preferred in terms of excellent handling.

The conditions for curing by irradiation with the active energy ray in the above resin layer are not particularly limited and can be appropriately adjusted according to the type and energy of the active energy ray to be irradiated, the shape, size, and the like of the resin layer. In the case of irradiation with an ultraviolet ray, it is, for example, preferably approximately from 1 to 1000 $mJ/cm^2$. In addition, for example, a high-pressure mercury lamp, an ultra high-pressure mercury lamp, a xenon lamp, a carbon arc, a metal halide lamp, the sunlight, an LED lamp, and a laser can be used for radiation with active energy rays. After radiation with active energy rays, the curing reaction can be further allowed to proceed by further subjecting to a heat treatment (annealing and aging).

The conditions for curing by heating the resin layer are not particularly limited but are, for example, preferably from 30 to 200° C., and more preferably from 50 to 190° C. The curing time can be appropriately set.

The laminated film is constituted of the resin layer having excellent elastic behavior and processability, and thus the laminated film can be produced by a roll-to-roll process. Producing the laminated film using a roll-to-roll process can significantly increase the productivity of the laminated film. The method for producing the laminated film by a roll-to-roll process is not particularly limited and a known or commonly used production method by a roll-to-roll process can be adopted, but the method includes the following as essential processes: feeding out a support wound in a roll form (Process A), applying a curable composition to at least one surface of the support fed out, then removing a solvent by drying as necessary, and then curing the curable composition to form a resin layer (Process B); and then winding the resulting laminate into a roll (Process C); and continuously carrying out these processes (Processes A to C). In addition, the method may also include steps in addition to steps A to C.

Image Display Device

The image display device according to the present disclosure includes the laminated film on a surface thereof.

The image display device according to the present disclosure is, for example, a display including the laminated film, and the display includes a liquid crystal display and a flexible display.

The image display device according to the present disclosure is, for example, an organic EL display device including the laminated film, and the organic EL display device is, for example, an organic EL display.

Examples of the flexible display include a foldable display (=a display that can be folded) and a rollable display (=a display that can be rolled).

In the display including the laminated film, the laminated film has a high level of surface hardness, and thus it is possible to prevent the surface of the display from being scratched. Further, excellent antifouling performance can be exhibited for a long period of time. Furthermore, since the laminated film has excellent bending resistance, even when the display is repeatedly folded, cracks do not occur in the laminated film, and good visibility can be maintained.

Flexible Device

A flexible device according to the present disclosure includes an image display device, and includes the laminated film on a surface of the device. The flexible device is preferably a flexible device including a flexible display.

Examples of the flexible device include a foldable device (=a device that can be folded) and a rollable device (=a device that can be rolled).

Examples of the flexible device include portable information terminals such as smartphones, tablets, touch screens, and wearable devices.

Since the flexible device includes a laminated film in which cracks do not occur even when the operation of bending and unbending is repeated, the flexible device is excellent in reliability and visibility. Further, the inclusion of the laminated film makes it possible to prevent the surface from being scratched, and to provide excellent antifouling performance for a long period of time.

EXAMPLES

Hereinafter, the present disclosure will be described in more detail based on examples, but the present disclosure is not limited by these examples.

The molecular weight of products was measured under the following conditions.

Alliance HPLC System 2695 (available from Waters)

Refractive Index Detector 2414 (available from Waters)

Column: Tskgel GMHHR-M (available from Tosoh Corporation)×2

Guard column: Tskgel guard column HHRL (available from Tosoh Corporation)

Column oven: Column Heater U-620 (available from Sugai)

Solvent: THF

Measurement temperature: 40° C.

In addition, the ratio of T2 form and T3 form [T3 form/T2 form] in the product was measured by $^{29}$Si-NMR spectrum measurement with JEOL ECA500 (500 MHz).

Production Example 1: Production of an Epoxy Group-Containing Low-Molecular Weight Polyorganosilsesquioxane 277.2 mmol (68.30 g) of 2-(3,4-epoxycyclohexyl)ethyltrimethoxysilane, 3.0 mmol (0.56 g) of phenyltrimethoxysilane, and 275.4 g of acetone were charged under a nitrogen stream into a 1000 mL flask (reaction vessel) equipped with a thermometer, a stirrer, a reflux condenser, and a nitrogen inlet tube, and the temperature was raised to 50° C. To the mixture thus obtained, 7.74 g of a 5% potassium carbonate aqueous solution (2.8 mmol as potassium carbonate) was added over 5 minutes, after which 2800.0 mmol (50.40 g) of water was added over 20 minutes. Here, no significant temperature increase occurred during the additions. Subsequently, a polycondensation reaction was performed under a nitrogen stream for 5 hours while maintaining the temperature at 50° C.

Next, the reaction solution was cooled, and simultaneous thereto, 137.70 g of methyl isobutyl ketone and 100.60 g of a 5% saline solution were added thereto. The solution was transferred to a 1 L separation funnel, and then 137.70 g of methyl isobutyl ketone was again added, and rinsing with water was performed. After the separation, the water layer was removed, and the lower layer liquid was rinsed with water until the lower layer liquid became neutral. The upper layer liquid was then fractioned, after which the solvent was distilled away from the upper layer liquid under conditions of 1 mmHg and 50° C., and 75.18 g of a colorless, transparent liquid product (an epoxy group-containing low-molecular weight polyorganosilsesquioxane) containing 23 wt. % of methyl isobutyl ketone was produced.

When the product was analyzed, the number average molecular weight was found to be 2235, and the molecular weight dispersity was 1.54. The ratio of T3 form to T2 form [T3 form/T2 form] calculated from the $^{29}$Si-NMR spectrum of the product was 11.9.

Figure 5:
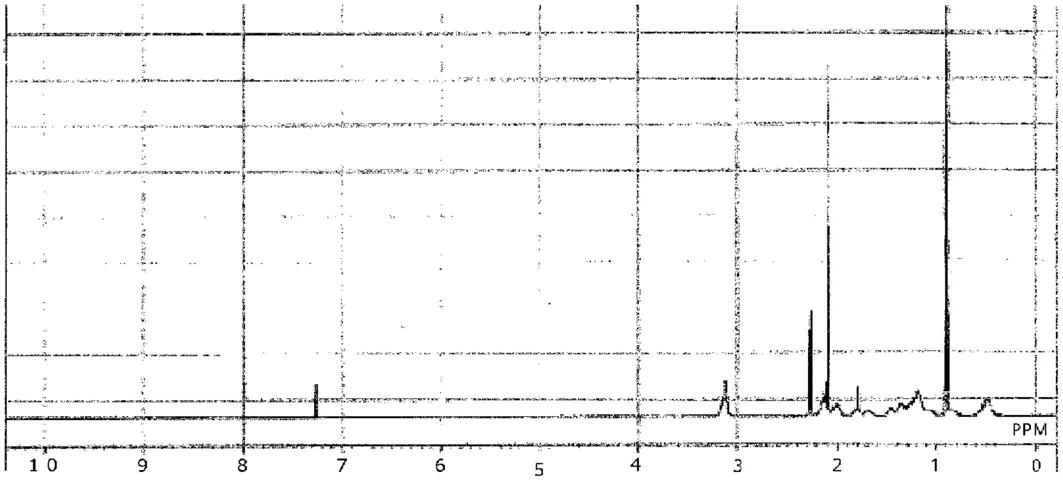
FIG. 5 is a $^1$H-NMR spectrum of an epoxy group-containing low-molecular weight polyorganosilsesquioxane produced in Production Example 1.
Figure 6:
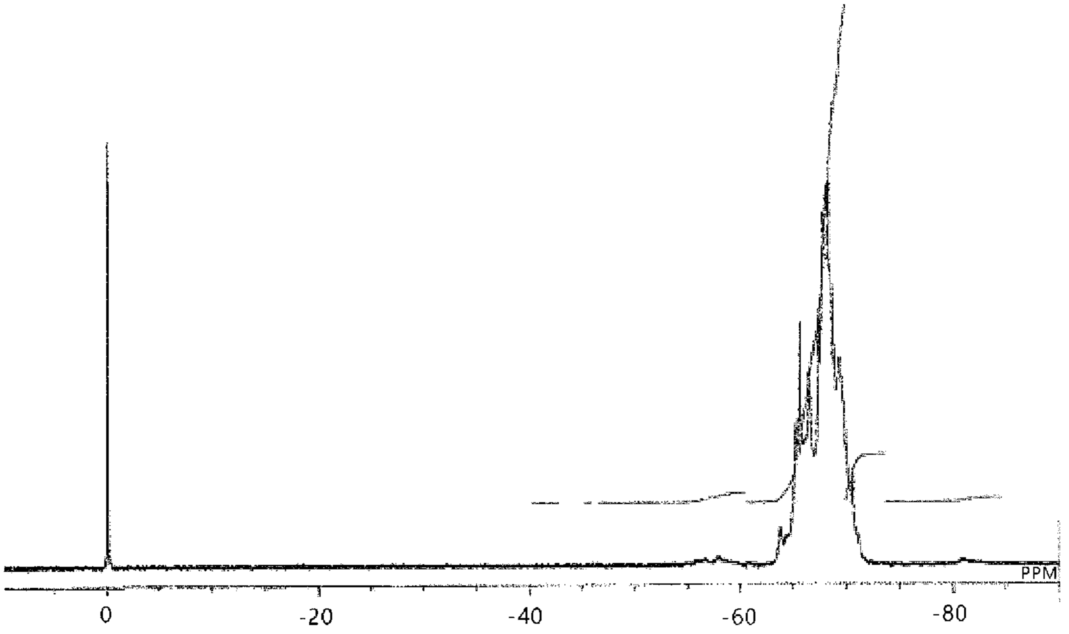
FIG. 6 is a $^{29}$Si-NMR spectrum of the epoxy group-containing low-molecular weight polyorganosilsesquioxane produced in Production Example 1.

A $^{1}$H-NMR spectrum of the produced epoxy group-containing low-molecular weight polyorganosilsesquioxane is illustrated in FIG. 5, and a $^{29}$Si-NMR spectrum thereof is illustrated in FIG. 6.

Production Example 2: Production of an Epoxy Group-Containing High-Molecular Weight Polyorganosilsesquioxane A mixture (75 g) containing the epoxy group-containing low-molecular weight polyorganosilsesquioxane produced in Production Example 1 was charged under a nitrogen stream into a 1000 mL flask (reaction vessel) equipped with a thermometer, a stirrer, a reflux condenser, and a nitrogen inlet tube. Next, 100 ppm (5.6 mg) of potassium hydroxide and 2000 ppm (112 mg) of water were added to the net content of the epoxy group-containing low-molecular weight polyorganosilsesquioxane, and the mixture was heated for 18 hours at 80° C., and then the mixture was sampled, and the molecular weight was measured. It was found that the number average molecular weight Mn increased to 6000. Next, the mixture was cooled to room temperature, 300 mL of methyl isobutyl ketone was added, and 300 mL of water was added, and when the alkali component was removed through repeated rinsing with water and the mixture was concentrated, 74.5 g of a colorless, transparent liquid product (epoxy group-containing high-molecular weight polyorganosilsesquioxane 1) containing 25 wt. % of methyl isobutyl ketone was produced.

When the product was analyzed, the number average molecular weight was found to be 6176, and the molecular weight dispersity was 2.31. The ratio of T3 form to T2 form [T3 form/T2 form] calculated from the $^{29}$Si-NMR spectrum of the product was 50.2.

Figure 7:
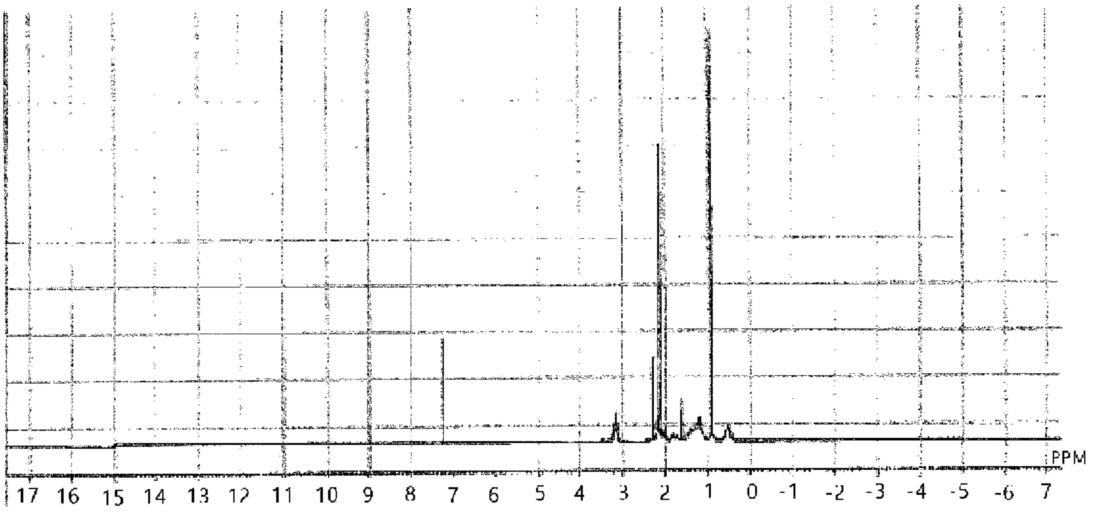
FIG. 7 is a $^1$H-NMR spectrum of an epoxy group-containing high-molecular weight polyorganosilsesquioxane produced in Production Example 2.
Figure 8:
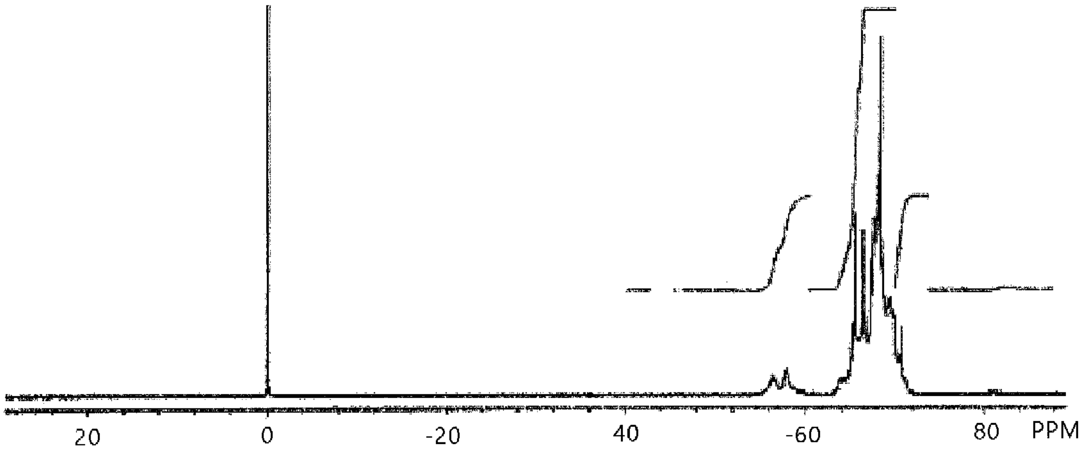
FIG. 8 is a $^{29}$Si-NMR spectrum of the epoxy group-containing high-molecular weight polyorganosilsesquioxane produced in Production Example 2.

A $^{1}$H—H-NMR spectrum of the prepared epoxy group-containing high-molecular weight polyorganosilsesquioxane 1 is illustrated in FIG. 7, and a $^{29}$Si—H-NMR spectrum thereof is illustrated in FIG. 8.

Example 1: Production of Hard Coat Film

A mixed solution having a blending ratio shown in Table 1 was prepared and used as a hard coat liquid (curable composition). The hard coat liquid prepared as described above was applied to the surface of a PET film (trade name: Lumirror (Trade name) #50-U40, thickness: 50 μm, available from Toray Industries, Inc.) using a wire bar #14 to cause the hard coat layer after curing of the hard coat liquid to have a thickness of 10 μm. Thereafter, the resultant film was left in an oven at 150° C. for 2 minutes, and then irradiated with ultraviolet rays at an illuminance of 600 mJ/cm$^2$ using a high pressure mercury lamp (available from EYE GRAPHICS Co., Ltd.). Thereafter, the coating film of the hard coat liquid was heat-treated at 150° C. for 60 minutes to cure the coating film, and thus a hard coat film having a hard coat layer was produced.

TABLE 1

| | Material name | Solid content percentage (%) | Component percentage (%) |
|---|---|---|---|
| Resin | Production Example 1 | 77 | 66.8 |
| | 200PA-E5 | 100 | 1.5 |
| | Epolight 1600 | 100 | 6.2 |
| Radical polymerization initiator | Omnirad 127 | 100 | 0.2 |
| Cationic polymerization initiator | CPI-310FG | 100 | 0.5 |
| Antioxidant | ADK Stab AO-20 | 100 | 0.2 |
| Surface modifier | KY1203 | 20 | 0.4 |
| Solvent | MIBK | | 8.4 |
| | MEK | | 15.8 |

Example 2: Production of Hard Coat Film

A hard coat film was prepared in the same manner as in Example 1 except that the thickness of the hard coat layer was changed to 20 μm.

Example 3: Production of Hard Coat Film

A hard coat film was produced in the same manner as in Example 1 except that a hard coat liquid having a blending ratio shown in Table 2 was used.

TABLE 2

| | Material name | Solid content percentage (%) | Component percentage (%) |
|---|---|---|---|
| Resin | Production Example 1 | 77 | 66.8 |
| | 200PA-E5 | 100 | 7.7 |
| | Epolight 1600 | 100 | 0 |
| Radical polymerization initiator | Omnirad 127 | 100 | 0.2 |
| Cationic polymerization initiator | CPI-310FG | 100 | 0.5 |
| Antioxidant | ADK Stab AO-20 | 100 | 0.2 |
| Surface modifier | KY1203 | 20 | 0.4 |
| Solvent | MIBK | | 8.4 |
| | MEK | | 15.8 |

Example 4: Production of Hard Coat Film

A hard coat film was prepared in the same manner as in Example 3 except that the thickness of the hard coat layer was changed to 20 μm.

Example 5: Production of Hard Coat Film

A hard coat film was produced in the same manner as in Example 1 except that a hard coat liquid having a blending ratio shown in Table 3 was used.

TABLE 3

| | Material name | Solid content percentage (%) | Component percentage (%) |
|---|---|---|---|
| Resin | Production Example 1 | 77 | 66.9 |
| | 200PA-E5 | 100 | 1.5 |
| | Epolight 1600(N) | 100 | 6.2 |
| Radical polymerization initiator | Omnirad 127 | 100 | 0 |
| Cationic polymerization initiator | CPI-310FG | 100 | 0.5 |
| Antioxidant | ADK Stab AO-20 | 100 | 0.2 |
| Surface modifier | KY1203 | 20 | 0.4 |
| Solvent | MIBK | | 8.4 |
| | MEK | | 15.8 |

Example 6: Production of Hard Coat Film

A hard coat film was prepared in the same manner as in Example 5 except that the thickness of the hard coat layer was changed to 20 μm.

Comparative Example 1: Production of Hard Coat Film

A hard coat film was produced in the same manner as in Example 1 except that a hard coat liquid having a blending ratio shown in Table 4 was used.

TABLE 4

| | Material name | Solid content percentage (%) | Component percentage (%) |
|---|---|---|---|
| Resin | Production Example 1 | 77 | 67.9 |
| | 200PA-E5 | 100 | 5.8 |
| Cationic polymerization initiator | CPI-210S | 100 | 1.2 |
| Surface modifier | FT601ADH2 | 25 | 0.9 |
| Solvent | MIBK | | 16.2 |
| | MEK | | 8.0 |

Comparative Example 2: Production of Hard Coat Film

A hard coat film was prepared in the same manner as in Comparative Example 1 except that the thickness of the hard coat layer was changed to 20 μm.

The hard coat films produced in Examples and Comparative Examples were evaluated for the following items. The results are shown in Table 5.

Haze and Total Light Transmittance

The haze and total light transmittance of the hard coat films produced above were measured using a haze meter (NDH-5000W, available from Nippon Denshoku Industries Co., Ltd.).

Surface Hardness: Pencil Hardness

The pencil hardness of the surface of the hard coat layer in each of the hard coat films produced above was evaluated in accordance with JIS K5600-5-4 (at a load of 750 g).

Scratch Resistance

A #0000 steel wool was traveled back and forth on the surface of the hard coat layer in each of the hard coat films produced above 1000 times and 10000 times with a load of 1000 g/cm$^2$, and the presence or absence of scratches on the surface of the hard coat layer was confirmed.

Water Contact Angle: Initial Value

The water contact angle (°) of the surface of each of the hard coat films produced above (the surface of the hard coat layer) was measured by a sessile drop method.

Water Contact Angle: After Steel Wool Test

A #0000 steel wool was traveled back and forth on the surface of the hard coat layer in each of the hard coat films produced above 1000 times with a load of 1000 g/cm$^2$, and the water contact angle (°) on the tested areas was measured by the sessile drop method.

Bendability (1): Cylindrical Mandrel Method

The hard coat surface of each of the hard coat films produced above was bent into a concave shape (inward) with a curvature radius (mm) at which no cracks occurred on the surface of the hard coat layer using a cylindrical mandrel in accordance with JIS K 5600-5-1, and then the bendability (1) was evaluated.

Bendability (2): Cylindrical Mandrel Method

The hard coat surface of each of the hard coat films produced above was bent into a convex shape (outward) with a curvature radius (mm) at which no cracks occurred on the surface of the hard coat layer using a cylindrical mandrel in accordance with JIS K 5600-5-1, and then the bendability (2) was evaluated.

Bending Resistance (1)

The bending resistance of each of the hard coat films produced above was measured using a planar body unloaded U-shaped stretching tester (Z-044, available from Yuasa System Co., Ltd.). In the measurement, the surface of the hard coat layer was bent into a concave shape (inward) with a curvature radius of 2.5 mm, the operation was performed 50000 times at a rate of 30 to 60 cycles/min, and the presence or absence of cracks in the hard coat layer was checked (See FIGS. 3 and 4).

Bending Resistance (2)

The bending resistance of each of the hard coat films produced above was measured using a planar body unloaded U-shaped stretching tester (Z-044, available from Yuasa System Co., Ltd.). In the measurement, the surface of the hard coat layer was bent into a convex shape (outward) with a curvature radius of 4.0 mm, the operation was performed 10000 times at a rate of 30 to 60 cycles/min, and the presence or absence of cracks in the hard coat layer was checked (See FIGS. 3 and 4).

TABLE 5

| | | Example 1 | Example 2 | Example 3 | Example 4 | Example 5 | Example 6 | Comparative Example 1 | Comparative Example 2 |
|---|---|---|---|---|---|---|---|---|---|
| Film thickness (μm) | | 10 | 20 | 10 | 20 | 10 | 20 | 10 | 20 |
| Haze (%) | | 1.0 | 1.1 | 1.2 | 1.3 | 1.2 | 1.3 | 1.1 | 1.3 |
| Total light transmittance (%) | | 91.4 | 91.3 | 91.6 | 91.4 | 91.5 | 91.4 | 91.1 | 91.0 |
| Pencil hardness | Load: 750 g | H | 3H | H | 2H | H | 2H | H | 2H |
| Scratch Resistance | Rubbing back and forth at 1 kg/cm$^2$ 1K | No scratches | No scratches | No scratches | No scratches | No scratches | No scratches | Scratches | Scratches |
| | Rubbing back and forth at 1 kg/cm$^2$ 10K | No scratches | No scratches | Scratches | Scratches | Scratches | Scratches | Scratches | Scratches |
| Water contact angle (°) | Initial value | 110 | 110 | 107 | 107 | 107 | 107 | 105 | 105 |
| | SW 1 kg/cm$^2$ rubbing back and forth at 1K | 108 | 108 | 94 | 94 | 93 | 95 | 75 | 77 |
| Mandrel | Bendability (1) | 2 mmφ | 2 mmφ | 2 mmφ | 2 mmφ | 2 mmφ | 2 mmφ | 2 mmφ | 2 mmφ |
| | Bendability (2) | 3 mmφ | 4 mmφ | 4 mmφ | 4 mmφ | 4 mmφ | 4 mmφ | 4 mmφ | 4 mmφ |
| Continuous bending | Bending resistance (1) | No cracks | No cracks | No cracks | No cracks | No cracks | No cracks | No cracks | No cracks |
| | Bending resistance (2) | No cracks | No cracks | No cracks | No cracks | No cracks | No cracks | No cracks | No cracks |

The components that were used in Examples and Comparative Examples are as follows.

Resin

Production Example 1: Production of Epoxy Group-Containing Low-Molecular Weight Polyorganosilsesquioxane Produced in Production Example 1

Polyorganosilsesquioxane of Present Disclosure

- 200PA-E5: trade name "Epoxy Ester 200PA-E5", main component: tripropylene glycol diglycidyl ether half (meth)acrylate (corresponding to the compound A, epoxy group equivalent weight: 100, acrylic group equivalent weight: 100), available from Kyoeisha Chemical Co., Ltd.
- Epolight 1600: trade name "Epolight 1600", 1,6-hexanediol diglycidyl ether (corresponding to the compound B, epoxy group equivalent weight: 151), available from Kyoeisha Chemical Co., Ltd.

Radical Polymerization Initiator

- Omnirad127: trade name "Omnirad127", 2-hydroxy-1-{4-[4-(2-hydroxy-2-methyl-propionyl)-benzyl]phenyl}-2-methyl-propan-1-one, photoradical polymerization initiator Cationic Polymerization Initiator

- CPI-310FG: trade name "CPI-310FG", photocationic polymerization initiator, available from San-Apro Ltd.
- CPI-210S: trade name "CPI-210S", photocationic polymerization initiator, available from San-Apro Ltd.

Antioxidant

- ADK Stab AO-20: trade name "ADK Stab AO-20", 1,3,5-tris(3',5'-di-t-butyl-4'-hydroxybenzyl)-s-triazine-2,4,6-(1H,3H,5H)trione (phenol-based antioxidant), available from ADEKA Corporation Fluorine-Containing Polymerizable Compound

- KY1203: trade name "SUBELYN KY-1203", perfluoropolyether-modified acrylate, available from Shin-Etsu Chemical Co., Ltd.
- FT601ADH2: trade name "FTERGENT 601ADH2", available from Neos Company Limited Solvent

- MIBK: Methyl isobutyl ketone
- MEK: Methyl ethyl ketone

Each aspect disclosed in the present specification can be combined with any other feature disclosed herein.

Note that each of the configurations, combinations thereof, and the like in each of the embodiments are an example, and various additions, omissions, substitutions, and other changes may be made as appropriate without departing from the spirit of the present disclosure. The present disclosure is not limited by the embodiments and is limited only by the claims.

As a summary of the above, configurations and variations of the present disclosure are described below.

(1) A laminated film including: a support; and a resin layer laminated on at least one surface of the support, the resin layer, or one of the resin layers when the resin layers are laminated on both surfaces of the support, satisfying the following Conditions 1, 2, and 3:

Condition 1:

in a pencil hardness test specified in JIS K5600 5-4 (1999) at a load of 750 g, a pencil hardness is F or greater on a surface of the resin layer of the laminated film;

Condition 2:

in a cylindrical mandrel test according to a method specified in JIS K5600-5-1 (1999), where the surface of the resin layer of the laminated film is bent into a convex shape, no cracks occur on the surface of the resin layer with a curvature radius of 5 mm; and Condition 3:

a surface of the resin layer of the laminated film has a water contact angle of or greater before subjected to a steel wool abrasion test where the surface of the resin layer is rubbed back and forth 1000 times with #0000 steel wool while a load of 1 $kg/cm^2$ is applied, and a water contact angle on tested areas of the surface is 90° or greater after subjected to the test.

(2) The laminated film according to (1), in which the resin layer, or one of the resin layers when the resin layers are laminated on both surfaces of the support, further satisfies the following Condition (Condition 4):

Condition 4: in the following bending resistance test, a number of operations it takes for cracks to occur in the resin layer is 10000 times or more:

bending resistance test:

when an operation of bending the laminated film from an unbent state to a direction where the surface of the resin layer is bent by 180° into a convex shape with a curvature radius (R) of 4.0 mm and unbending the bent laminated film again is defined as one cycle, the operation is performed at a rate of 30 to 60 cycles/min.

(3) The laminated film according to (1) or (2), in which the resin layer, or one of the resin layers when the resin layers are laminated on both surfaces of the support, further satisfies the following Condition (Condition 5):

Condition 5: no scratches are visually observed in a steel wool abrasion test where the surface of the resin layer is rubbed back and forth 1000 times with #0000 steel wool while a load of 1 $kg/cm^2$ is applied.

(4) The laminated film according to any one of (1) to (3), in which the resin layer, or when resin layers are laminated on both surfaces of the support, one of the resin layers, has a haze of 1.0% or less.

(5) The laminated film according to any one of (1) to (4), in which the resin layer includes a cured product of a curable composition containing one or more curable compounds, and at least one of the curable compounds is a polyorganosilsesquioxane.

(6) The laminated film according to (5), in which the curable composition contains a compound having one or more cationically polymerizable groups and one or more radically polymerizable groups in a molecule.

(7) The laminated film according to (5) or (6), in which the curable composition further contains a fluorine-containing radically polymerizable compound.

(8) The laminated film according to any one of (5) to (7), in which the curable composition further contains an aliphatic compound having two or more cationically polymerizable groups in a molecule.

(9) The laminated film according to any one of (1) to (4), in which the resin layer includes a cured product of the following Curable composition:

Curable composition: as a curable compound, containing a polyorganosilsesquioxane including a T3 form and a T2 form as constituent units, having a T3 form/T2 form (molar ratio) of 5 or greater, and containing, as a T3 form, a constituent unit represented by the following Formula (1):

$$[R^1SiO_{3/2}] \quad (1)$$

where $R^1$ represents a group containing a cationically polymerizable functional group.

(10) The laminated film according to any one of (1) to (4), in which the resin layer includes a cured product of the following Curable composition:

Curable composition: as a curable compound, containing a polyorganosilsesquioxane including a T3 form and a T2 form as constituent units, having a T3 form/T2 form (molar ratio) of 5 or greater, and containing, as T3 forms, constituent units represented by the following Formulas (1) and (2):

$$[R^1SiO_{3/2}] \quad (1)$$

where $R^1$ represents a group containing a cationically polymerizable functional group $$[R^2SiO_{3/2}] \quad (2)$$

where $R^2$ represents a substituted or unsubstituted aryl group.

(11) The laminated film according to (9) or (10), in which the curable composition further contains a compound A having one or more cationically polymerizable groups and one or more radically polymerizable groups in a molecule, and a content of the compound A is from 1 to 100 parts by weight relative to 100 parts by weight of the polyorganosilsesquioxane.

(12) The laminated film according to any one of (9) to (11), in which the curable composition further contains the compound A having one or more cationically polymerizable groups and one or more radically polymerizable groups in a molecule and a fluorine-containing radically polymerizable compound F in a proportion of 0.05 to 0.5 parts by weight of the compound F relative to 1 part by weight of the compound A.

(13) The laminated film according to any one of (9) to (12), in which the curable composition further contains an aliphatic compound B having two or more cationically polymerizable groups in a molecule, and a content of the compound B is from 1 to 50 parts by weight relative to 100 parts by weight of the polyorganosilsesquioxane.

(14) The laminated film according to (13), in which a content ratio of the compound A and the compound B (compound A/compound B; weight ratio) is from 1/0.5 to 1/10.

(15) The laminated film according to (14), in which the curing catalyst contains a cationic polymerization initiator.

(16) The laminated film according to (14) or (15), in which the curing catalyst contains a radical polymerization initiator.

(17) The laminated film according to any one of (1) to (16), in which the support includes a transparent support.

(18) An image display device including the laminated film described in any one of (1) to (17).

(19) An organic electroluminescent display device including the laminated film described in any one of (1) to (17).

(20) A flexible display including the laminated film described in any one of (1) to (17).

(21) A liquid crystal display including the laminated film described in any one of (1) to (17).

(22) An organic electroluminescent display including the laminated film described in any one of (1) to (17).

(23) A flexible device including the image display device described in (18) or (19).

(24) A flexible device including the display described in any one of (20) to (22).

(25) A flexible device including the laminated film described in any one of (1) to (17).

(26) A flexible device including the flexible display described in (20).

INDUSTRIAL APPLICABILITY

The laminated film of the present disclosure has a high level of surface hardness and excellent bendability and bending resistance, and also has antifouling performance that hardly deteriorates. Consequently, the laminated film is suitable as a surface protective material for a flexible display such as an organic EL display device.

REFERENCE SIGNS LIST

1, 2 Laminated film
20 Support
11, 21, 22 Resin layer

The invention claimed is:

1. A laminated film comprising:
a support; and
a resin layer laminated on at least one surface of the support, the resin layer, or one of the resin layers when the resin layers are laminated on both surfaces of the support, satisfying the following Conditions 1, 2, and 3:
Condition 1:
in a pencil hardness test specified in JIS K5600 5-4 (1999) at a load of 750 g, a pencil hardness is F or greater on a surface of the resin layer of the laminated film;
Condition 2:
in a cylindrical mandrel test according to a method specified in JIS K5600-5-1 (1999), where the surface of the resin layer of the laminated film is bent into a convex shape, no cracks occur on the surface of the resin layer with a curvature radius of 5 mm; and
Condition 3:
a surface of the resin layer of the laminated film has a water contact angle of 95° or greater before subjected to a steel wool abrasion test where the surface of the resin layer is rubbed back and forth 1000 times with #0000 steel wool while a load of 1 $kg/cm^2$ is applied, and a water contact angle on tested areas of the surface is 90° or greater after subjected to the test;
wherein the resin layer is a cured product of a curable composition;
wherein the curable composition comprises a polyorganosilsesquioxane, a compound A, and an aliphatic compound B;
wherein the compound A contains a group selected from a hydroxyl group, an epoxy group, an oxetanyl group, and a vinyl ether group, and a group selected from (meth) acryloyl group and vinyl group; and
wherein the aliphatic compound B excludes compounds corresponding to compound A and contains two or more groups selected from epoxy group, oxetanyl group, and vinyl ether group;
wherein a content of the compound A is from 1 to 100 parts by weight relative to 100 parts by weight of the polyorganosilsesquioxane; and
wherein a content of the aliphatic compound B is 1 to 50 parts by weight per 100 parts by weight of the polyorganosilsesquioxane.

2. The laminated film according to claim 1, wherein the resin layer, or one of the resin layers when the resin layers are laminated on both surfaces of the support, further satisfies the following Condition (Condition 4):
Condition 4: in the following bending resistance test, a number of operations it takes for cracks to occur in the resin layer is 10000 times or more:
bending resistance test:
when an operation of bending the laminated film from an unbent state to a direction where the surface of the resin layer is bent by 180° into a convex shape with a curvature radius (R) of 4.0 mm and unbending the bent laminated film again is defined as one cycle, the operation is performed at a rate of 30 to 60 cycles/min.

3. The laminated film according to claim 1, wherein the resin layer, or one of the resin layers when the resin layers are laminated on both surfaces of the support, further satisfies the following Condition (Condition 5):
Condition 5: no scratches are visually observed in a steel wool abrasion test where the surface of the resin layer is rubbed back and forth 1000 times with #0000 steel wool while a load of 1 $kg/cm^2$ is applied.

4. The laminated film according to claim 1, wherein the resin layer, or one of the resin layers when the resin layers are laminated on both surfaces of the support, has a haze of 1.0% or less.

5. The laminated film according to claim 1, having a haze of 7% or less.

6. The laminated film according to claim 1, wherein the curable composition further comprises a curing catalyst.

7. The laminated film according to claim 6, wherein the curing catalyst comprises a cationic polymerization initiator.

8. The laminated film according to claim 6, wherein the curing catalyst comprises a radical polymerization initiator.

9. The laminated film according to claim 1, wherein the curable composition further comprises a fluorine-containing radically polymerizable compound.

10. The laminated film according to claim 1, wherein the support comprises a transparent support.

11. An image display device comprising the laminated film described in claim 1.

12. The image display device according to claim 11, which is a flexible display.

13. The image display device according to claim 11, which is an organic electroluminescent display device.

14. A flexible device comprising the image display device described claim 11.

* * * * *